United States Patent
Park et al.

(10) Patent No.: US 12,085,802 B2
(45) Date of Patent: Sep. 10, 2024

(54) DISPLAY APPARATUS AND LIGHT SOURCE APPARATUS THEREOF

(71) Applicant: SAMSUNG ELECTRONICS CO., LTD., Suwon-si (KR)

(72) Inventors: Chunsoon Park, Suwon-si (KR); Sungyeol Kim, Suwon-si (KR); Seungyong Shin, Suwon-si (KR); Jonghoon Jung, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 18/118,979

(22) Filed: Mar. 8, 2023

(65) Prior Publication Data
US 2023/0384636 A1  Nov. 30, 2023

Related U.S. Application Data

(63) Continuation of application No. PCT/KR2023/002452, filed on Feb. 21, 2023.

(30) Foreign Application Priority Data

May 31, 2022 (KR) .................. 10-2022-0067228

(51) Int. Cl.
*G02F 1/13357* (2006.01)
*G02F 1/1335* (2006.01)
(Continued)

(52) U.S. Cl.
CPC .. *G02F 1/133603* (2013.01); *G02F 1/133612* (2021.01); *H01L 25/0753* (2013.01);
(Continued)

(58) Field of Classification Search
CPC .............. G02F 1/133603; H01L 33/62; H01L 25/0753; H10K 2102/341; H10K 59/131
See application file for complete search history.

(56) References Cited

U.S. PATENT DOCUMENTS 8,232,565 B2  7/2012  Lee et al.
8,400,064 B2*  3/2013  Wei ................. H01L 25/167
                                                    315/249

(Continued)

FOREIGN PATENT DOCUMENTS

EP   2239776 B1   9/2021
JP   2015-50342 A   3/2015
(Continued)

OTHER PUBLICATIONS

Communication dated Jun. 9, 2023, issued by the International Searching Authority in counterpart International Application No. PCT/KR2023/002452 (PCT/ISA/210).
(Continued)

*Primary Examiner* — Jessica M Merlin
(74) *Attorney, Agent, or Firm* — Sughrue Mion, PLLC

(57) ABSTRACT

Provided is a display apparatus having an improved degree of freedom in wiring design, the display apparatus including: a liquid crystal panel; and a light source apparatus, wherein the light source apparatus includes: a substrate; and a plurality of light emitting diodes (LEDs) provided on the substrate, wherein each of the plurality of LEDs has a lower surface in contact with a first feeding pad and a second feeding pad formed on the substrate, the lower surface of each of the plurality of LEDs includes a first contact area provided to be in contact with the first feeding pad, a second contact area provided to be in contact with the second feeding pad, and a non-contact area other than the first contact area and the second contact area on the lower surface, and each of the first contact area and the second contact area is smaller than the non-contact area.

16 Claims, 18 Drawing Sheets

(51) Int. Cl.
*H01L 25/075* (2006.01)
*H01L 33/62* (2010.01)
*H10K 59/131* (2023.01)

(52) U.S. Cl.
CPC ........... *H01L 33/62* (2013.01); *H10K 59/131* (2023.02); *G02F 2201/50* (2013.01)

(56) References Cited

U.S. PATENT DOCUMENTS

| | | |
|---|---|---|
| 9,454,036 B2 | 9/2016 | Lee et al. |
| 9,590,154 B2 | 3/2017 | Horikawa |
| 11,316,087 B2* | 4/2022 | Kawano ................. H01L 33/36 |
| 11,385,500 B2 | 7/2022 | Jang et al. |
| 2008/0036940 A1* | 2/2008 | Song ................. G02F 1/133608 |
| | | 362/249.16 |
| 2011/0050111 A1* | 3/2011 | Tanaka ................. G09G 3/3406 |
| | | 315/294 |
| 2015/0060920 A1* | 3/2015 | Horikawa .............. H05K 1/188 |
| | | 361/761 |

FOREIGN PATENT DOCUMENTS

| | | |
|---|---|---|
| JP | 6139976 B2 | 5/2017 |
| JP | 2019-125746 A | 7/2019 |
| JP | 2021-57498 A | 4/2021 |
| KR | 10-2008-0013592 A | 2/2008 |
| KR | 10-2011-0132729 A | 12/2011 |
| KR | 10-2012-0066652 A | 6/2012 |
| KR | 10-2014-0144828 A | 12/2014 |
| KR | 10-1609866 B1 | 4/2016 |
| KR | 10-2019-0053720 A | 5/2019 |
| KR | 10-2022-0054107 A | 5/2022 |

OTHER PUBLICATIONS

Communication dated Jun. 9, 2023, issued by the International Searching Authority in counterpart International Application No. PCT/KR2023/002452 (PCT/ISA/237).

* cited by examiner

DISPLAY APPARATUS AND LIGHT SOURCE APPARATUS THEREOF

CROSS-REFERENCE TO RELATED APPLICATION(S)

This application is a bypass continuation application of International Application No. PCT/KR2023/002452, filed on Feb. 21, 2023, which claims priority to Korean Patent Application No. 10-2022-0067228, filed on May 31, 2022, in the Korean Intellectual Property Office, the disclosures of which are incorporated by reference herein in their entireties.

BACKGROUND

1. Field

The disclosure relates to a display apparatus and a light source apparatus thereof, and more specifically, to a display apparatus having an improved degree of freedom in wiring design.

2. Description of Related Art

Generally, a display apparatus is a kind of an output apparatus that converts obtained or stored electrical information into visual information and displays the visual information to a user, and the display apparatus is used in various fields, such as home or workplace.

The display apparatus includes a monitor apparatus connected to a personal computer or a server computer, a portable computer device, a navigation terminal device, a general television apparatus, an Internet Protocol television (IPTV), a portable terminal device, such as a smart phone, a tablet PC, a personal digital assistant (PDA) or a cellular phone, various display apparatuses used to reproduce images, such as advertisements or movies in an industrial field, or various kinds of audio/video systems.

The display apparatus includes a light source module to convert electrical information into visual information, and the light source module includes a plurality of light sources configured to independently emit light. Each of the plurality of light sources includes a light emitting diode (LED) or an organic light emitting diode (OLED). For example, LEDs or OLEDs may be mounted on a circuit board or a substrate.

In recent years, display apparatuses have become thinner, and in order to accomplish a better contrast ratio, the number of light sources included in a display apparatus has increased. In order to implement a thin display apparatus, light source modules have also become thinner.

However, as the thickness of light source modules decreases while the number of light sources increases, the physical space for arranging various wires has become narrowed.

SUMMARY

Therefore, it is an aspect of the disclosure to provide a display apparatus capable of improving the degree of freedom in wiring design by securing a physical space for arranging various wires, and a light source apparatus thereof.

Additional aspects of the disclosure will be set forth in part in the description which follows and, in part, will be obvious from the description, or may be learned by practice of the disclosure.

In accordance with an aspect of the disclosure, a display apparatus includes: a liquid crystal panel; and a light source apparatus comprising a substrate and a plurality of light emitting diodes (LEDs) disposed on the substrate, wherein each LED of the plurality of LEDs comprises a lower surface in contact with a first feeding pad and a second feeding pad, wherein the first feeding pad and the second feeding are formed on the substrate, wherein the lower surface of each LED of the plurality of LEDs comprises a first contact area configured to be in contact with the first feeding pad, a second contact area configured to be in contact with the second feeding pad, and a non-contact area distinct from the first contact area and the second contact, and wherein each of the first contact area and the second contact area is smaller than the non-contact area.

Additionally, with respect to a length direction of the plurality of LEDs, each of a length of the first contact area and a length of the second contact area may be shorter than a length of the non-contact area.

The substrate may include: a conductive layer in contact with the first feeding pad and the second feeding pad; and a protective layer disposed on the conductive layer, wherein the protective layer comprises a first window and a second window respectively exposing the first feeding pad and the second feeding pad to an outside.

Additionally, with respect to a length direction of the plurality of LEDs, each of a length of the first window and a length of the second window may be shorter than a distance between the first window and the second window.

The protective layer may further include at least one tunnel disposed between the first window and the second window and extending in a width direction of the plurality of LEDs.

Additionally, the plurality of LEDs may be disposed on the substrate in a matrix comprising a plurality of rows and a plurality of columns, wherein a length direction of each LED of the plurality of LEDs coincides with a length direction of the substrate, and wherein the at least one tunnel comprises a plurality of tunnels corresponding to the plurality of columns which are oriented in a direction corresponding with the plurality of columns.

Additionally, LEDs among the plurality of LEDs forming a given column of the plurality of columns may have alternating polarity directions, and LEDs among the plurality of LEDs forming a given row of the plurality of rows may have identical polarity directions.

Additionally, the plurality of LEDs may be disposed on the substrate in a matrix comprising a plurality of rows and a plurality of columns, wherein a length direction of the each LED of the plurality of LEDs coincides with a width direction of the substrate, and the at least one tunnel comprises a plurality of tunnels corresponding to the plurality of rows which are oriented in a direction corresponding with the plurality of rows.

Additionally, LEDs among the plurality of LEDs forming a given row of the plurality of rows may have alternating polarity directions, and LEDs among the plurality of LEDs forming a given column of the plurality of columns may have identical polarity directions.

The display apparatus may further include at least one wire configured to transmit an electrical signal required for operation of the display apparatus, wherein the at least one wire is disposed within the at least one tunnel.

According to an aspect of the disclosure, a light source apparatus includes: a substrate; and a plurality of light emitting diodes (LEDs) disposed on the substrate, wherein each LED of the plurality of LEDs comprises a lower surface in contact with a first feeding pad and a second feeding pad, wherein the first feeding pad and the second feeding pad are formed on the substrate, wherein the lower surface of each LED of the plurality of LEDs comprises a first contact area configured to be in contact with the first feeding pad, a second contact area configured to be in contact with the second feeding pad, and a non-contact area distinct from the first contact area and the second contact area, and wherein each of the first contact area and the second contact area is smaller than the non-contact area.

Additionally, with respect to a length direction of the plurality of LEDs, each of a length of the first contact area and a length of the second contact area may be shorter than a length of the non-contact area.

The substrate may include: a conductive layer in contact with the first feeding pad and the second feeding pad; and a protective layer disposed on the conductive layer, wherein the protective layer comprises a first window and a second window respectively exposing the first feeding pad and the second feeding pad to an outside.

Additionally, with respect to a length direction of the plurality of LEDs, each of a length of the first window and a length of the second window is shorter than a distance between the first window and the second window.

The protective layer may include at least one tunnel provided between the first window and the second window and extending in a width direction of the plurality of LEDs.

According to an aspect of the disclosure, a light source apparatus includes: a substrate; and a light emitting diodes (LED) disposed on the substrate, wherein the LED comprises a lower surface in contact with a first feeding pad and a second feeding pad, wherein the first feeding pad and the second feeding pad are formed on the substrate, wherein the lower surface of the LED comprises a first contact area configured to be in contact with the first feeding pad, a second contact area configured to be in contact with the second feeding pad, and a non-contact area distinct from the first contact area and the second contact area, and wherein each of the first contact area and the second contact area is smaller than the non-contact area.

The substrate may include: a conductive layer in contact with the first feeding pad and the second feeding pad; and a protective layer disposed on the conductive layer, wherein the protective layer comprises a first window and a second window respectively exposing the first feeding pad and the second feeding pad to an outside.

The protective layer may further include a tunnel disposed between the first window and the second window and extending in a width direction of the LED.

The display apparatus may further include at least one wire configured to transmit an electrical signal required for operation of the display apparatus, wherein the at least one wire is disposed within the tunnel.

BRIEF DESCRIPTION OF THE DRAWINGS

These and/or other aspects of the disclosure will become apparent and more readily appreciated from the following description of embodiments, taken in conjunction with the accompanying drawings of which.

DETAILED DESCRIPTION

Figure 1:
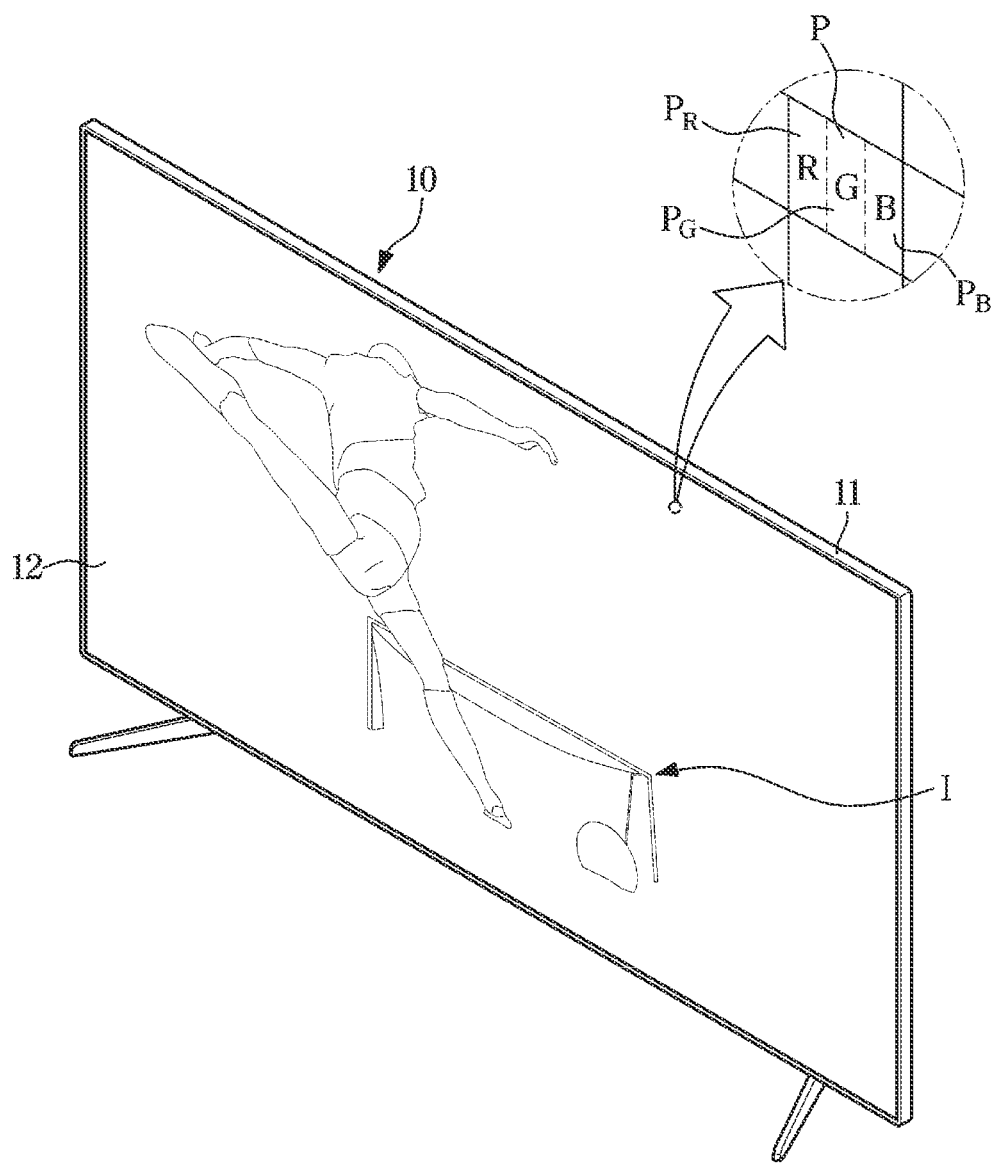
FIG. 1 is a view illustrating an external appearance of a display apparatus according to an embodiment.
Figure 1:
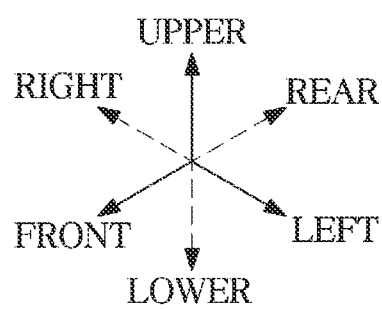

The embodiments described in the present specification and the configurations shown in the drawings are only examples, and various modifications may be made at the time of filing of the disclosure to replace the embodiments and drawings of the present specification.

The terms used herein are for the purpose of describing the embodiments and are not intended to restrict and/or to limit the disclosure.

For example, the singular expressions herein may include plural expressions, unless the context clearly dictates otherwise.

In addition, the terms "comprises" and "has" are intended to indicate that there are features, numbers, steps, operations, elements, parts, or combinations thereof described in the specification, and do not exclude the presence or addition of one or more other features, numbers, steps, operations, elements, parts, or combinations thereof.

It will be understood that, although the terms "first", "second", etc. may be used herein to describe various components, these components should not be limited by these terms. These terms are only used to distinguish one component from another.

Throughout the description, when a member is "on" another member, this includes not only when the member is in contact with the other member, but also when there is another member between the two members.

Herein, the expression "at least one of a, b or c" indicates only a, only b, only c, both a and b, both a and c, both b and c, or all of a, b, and c.

It will be understood that when an element is referred to as being "connected" with or to another element, it can be directly or indirectly connected to the other element, wherein the indirect connection includes "connection via a wireless communication network".

The terms, such as "~part", "~device", "~block", "~member", "~module", and the like may refer to a unit for processing at least one function or act. For example, the terms may refer to at least process processed by at least one hardware, such as field-programmable gate array (FPGA)/application specific integrated circuit (ASIC), software stored in memories, or processors.

Hereinafter, an embodiment of the disclosure will be described in detail with reference to the accompanying drawings. Throughout the drawings, like reference numbers or signs represent parts or components that perform substantially the same functions.

FIG. 1 illustrates an example of an appearance of a display apparatus according to an embodiment of the disclosure.

A display apparatus 10 is a device that processes an image signal received from an outside and visually displays the processed image. Hereinafter a case in which the display apparatus 10 is a television is exemplified, but the disclosure is not limited thereto. For example, the display apparatus 10 may be implemented in various forms, such as a monitor, a portable multimedia device, and a portable communication device, and the display apparatus 10 is not limited in its shape as long as visually displaying an image.

In addition, the display apparatus 10 may be a large format display (LFD) installed outdoors, such as a roof of a building or a bus stop. The outdoor is not limited to the outside of a building, and thus the display apparatus 10 according to an embodiment may be installed in any place as long as the display apparatus is accessed by a large number of people, even indoors, such as subway stations, shopping malls, movie theaters, companies, and stores.

The display apparatus 10 may receive content data including video data and audio data from various content sources and output video and audio corresponding to the video data and the audio data. For example, the display apparatus 10 may receive content data through a broadcast reception antenna or cable, receive content data from a content playback device, or receive content data from a content providing server of a content provider.

As illustrated in FIG. 1, the display apparatus 10 includes a body 11, a screen 12 provided to display an image I, and a support provided at a lower side of the body 11 to support the body 11.

The body 11 may form an appearance of the display apparatus 10, and the body 11 may include a component configured to allow the display apparatus 10 to display the image I and to perform various functions. Although the body 11 shown in FIG. 1 is in the form of a flat plate, the shape of the body 11 is not limited thereto. For example, the body 11 may have a curved plate shape.

The screen 12 may be formed on a front surface of the body 11, and display the image I. For example, the screen 12 may display a still image or a moving image. Further, the screen 12 may display a two-dimensional plane image or a three-dimensional image using binocular parallax of the user.

A plurality of pixels P may be formed on the screen 12 and the image I displayed on the screen 12 may be formed by a combination of the lights emitted from the plurality of pixels P. For example, the image I may be formed on the screen 12 by combining light emitted from the plurality of pixels P as a mosaic.

Each of the plurality of pixels P may emit different brightness and different color of light. For example, each of the plurality of pixels P may include a self-emissive panel (e.g., a LED panel) for directly emitting light or a non-emissive panel (e.g., a liquid crystal panel) for passing or blocking light emitted by a light source apparatus or the like.

In order to emit light in the various colors, the plurality of pixels P may include sub-pixels $P_R$, $P_G$, and $P_B$, respectively.

The sub-pixels $P_R$, $P_G$, and $P_B$ may include a red sub pixel $P_R$ emitting red light, a green sub pixel $P_G$ emitting green light, and a blue sub pixel $P_B$ emitting blue light. For example, the red light may represent a light beam having a wavelength of approximately 620 nm to 750 nm, the green light may represent a light beam having a wavelength of approximately 495 nm to 570 nm, and the blue light may represent a light beam having a wavelength of approximately 450 nm to 495 nm.

By combining the red light of the red sub pixel $P_R$, the green light of the green sub pixel $P_G$ and the blue light of the blue sub pixel $P_B$, each of the plurality of pixels P may emit different brightness and different color of light.

Figure 2:
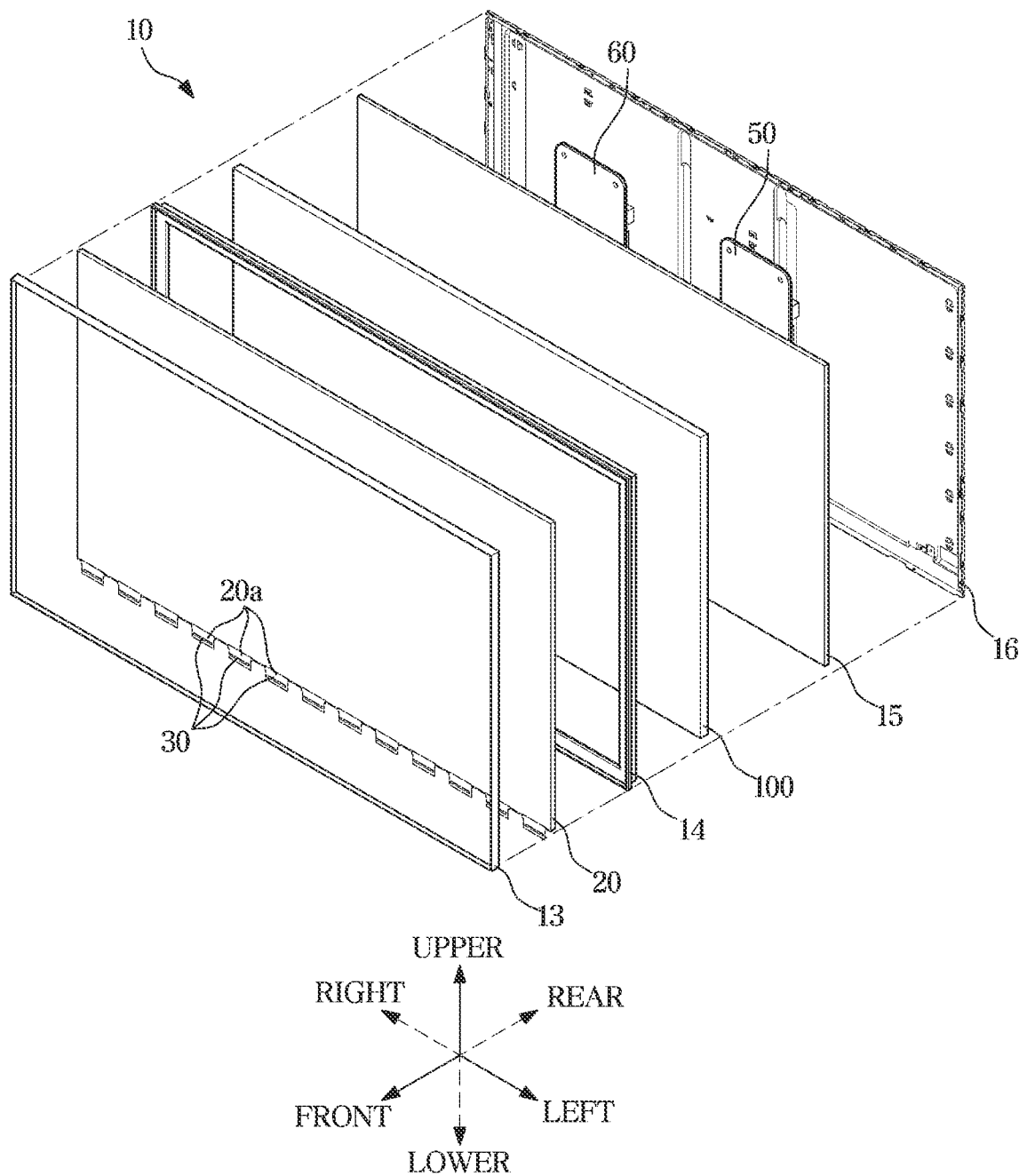
FIG. 2 is an exploded view illustrating a display apparatus according to an embodiment.

As shown in FIG. 2, various components configured to generate the image I on the screen 12 may be provided inside the body 11.

For example, the body 11 may include a light source apparatus 100 that is a surface light source, a liquid crystal panel 20 configured to block or transmit light emitted from the light source apparatus 100, a control assembly 50 configured to control an operation of the light source apparatus 100 and the liquid crystal panel 20, and a power assembly 60 configured to supply power to the light source apparatus 100 and the liquid crystal panel 20. Further, the body 11 may include a bezel 13, a frame middle mold 14, a bottom chassis 15 and a rear cover 16 which are provided to support and fix the liquid crystal panel 20, the light source apparatus 100, the control assembly 50 and the power assembly 60.

The light source apparatus 100 may include a point light source configured to emit monochromatic light or white light, and may refract, reflect, and scatter light emitted from the point light source so as to convert the light emitted from the point light source to surface light. For example, the light source apparatus 100 may include a plurality of light sources 111 emitting monochromatic light or white light, a diffuser plate 130 diffusing light incident from the plurality of light sources 111, a reflective sheet 120 reflecting light emitted from the plurality of light sources 111 and a rear surface of the diffuser plate 130, and an optical sheet 140 refracting and scattering light emitted from a front surface of the diffuser plate 130.

As mentioned above, the light source apparatus 100 may refract, reflect, and scatter light emitted from the point light source, thereby emitting uniform surface light toward the front.

A configuration of the light source apparatus 100 will be described in more detail below.

The liquid crystal panel 20 is provided in front of the light source apparatus 100 and blocks or transmits light emitted from the light source apparatus 100 to form the image I.

A front surface of the liquid crystal panel 20 may form the screen 12 of the display apparatus 10 described above, and the liquid crystal panel 20 may form the plurality of pixels P. In the liquid crystal panel 20, the plurality of pixels P may independently block or transmit light from the light source apparatus 100. The light transmitted through the plurality of pixels P may form the image I displayed on the screen 12.

Figure 3:
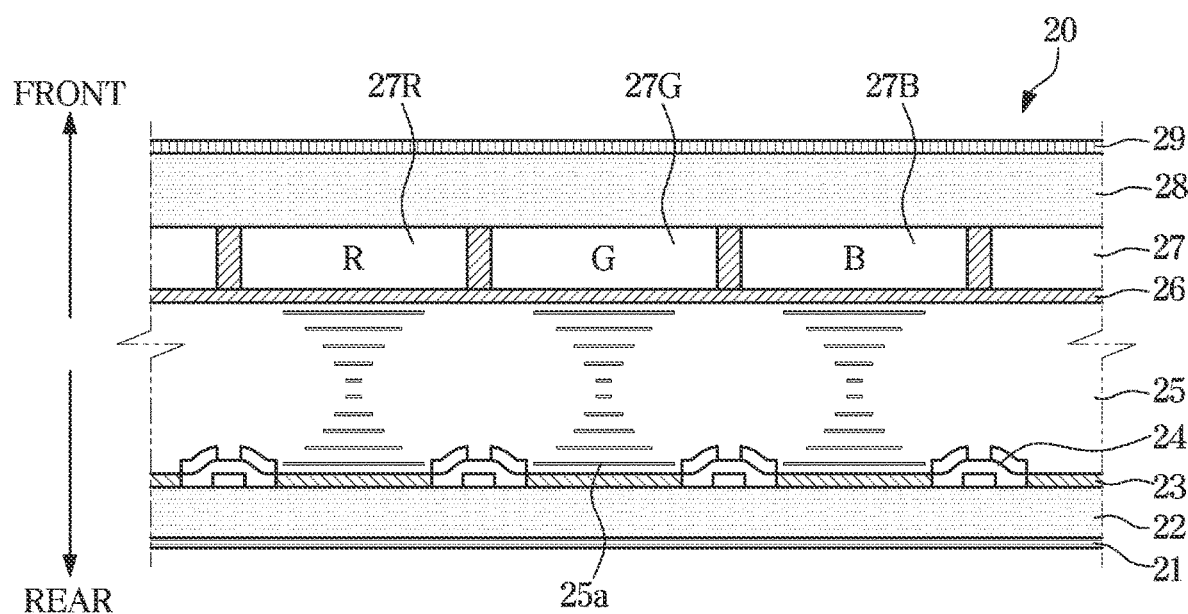
FIG. 3 is a side cross-sectional view illustrating a liquid crystal panel of a display apparatus according to an embodiment.

For example, as shown in FIG. 3, the liquid crystal panel 20 may include a first polarizing film 21, a first transparent substrate 22, a pixel electrode 23, a thin film transistor 24, a liquid crystal layer 25, a common electrode 26, a color filter 27, a second transparent substrate 28, and a second polarizing film 29.

The first transparent substrate 22 and the second transparent substrate 28 may fixedly support the pixel electrode 23, the thin film transistor 24, the liquid crystal layer 25, the common electrode 26, and the color filter 27. The first and second transparent substrates 22 and 28 may be formed of tempered glass or transparent resin.

On the outside of the first and second transparent substrates 22 and 28, the first polarizing film 21 and the second polarizing film 29 are provided.

Each of the first polarizing film 21 and the second polarizing film 29 may transmit a specific light beam and block other light beams. For example, the first polarizing film 21 may transmit a light beam having a magnetic field vibrating in a first direction and block other light beams. In addition, the second polarizing film 29 may transmit a light beam having a magnetic field vibrating in a second direction and block other light beams. In this case, the first direction and the second direction may be perpendicular to each other. Therefore, the polarization direction of light passing through the first polarizing film 21 and the vibration direction of light passing through the second polarizing film 29 are perpendicular to each other. As a result, generally, light may not pass through the first polarizing film 21 and the second polarizing film 29 at the same time.

On the inside of the second transparent substrate 28, the color filter 27 may be provided.

The color filter 27 may include a red filter 27R transmitting red light, a green filter 27G transmitting green light, and a blue filter 27B transmitting blue light. The red filter 27R, the green filter 27G, and the blue filter 27B may be disposed parallel to each other. A region, in which the color filter 27 is formed, corresponds to the pixel P described above. A region in which the red filter 27R is formed corresponds to the red sub-pixel $P_R$, a region in which the green filter 27G is formed corresponds to the green sub-pixel $P_G$, and a region in which the blue filter 27B is formed corresponds to the blue sub-pixel $P_B$.

The pixel electrode 23 may be provided inside the first transparent substrate 22, and the common electrode 26 may be provided inside the second transparent substrate 28.

The pixel electrode 23 and the common electrode 26 may be formed of a metal material through which electricity is conducted, and the pixel electrode 23 and the common electrode 26 may generate an electric field to change the arrangement of liquid crystal molecules 25a forming the liquid crystal layer 25 to be described below.

The pixel electrode 23 and the common electrode 26 may be formed of a transparent material and may pass light incident from the outside. For example, the pixel electrode 23 and the common electrode 26 may include indium tin oxide (ITO), indium zinc oxide (IZO), silver nano wire, carbon nanotube (CNT), graphene, or PEDOT (3,4-ethylenedioxythiophene).

The thin film transistor (TFT) 24 is provided inside the second transparent substrate 22.

The TFT 24 may transmit or block a current flowing through the pixel electrode 23. For example, an electric field may be formed or removed between the pixel electrode 23 and the common electrode 26 in response to turning on (closing) or turning off (opening) the TFT 24.

The TFT 24 may be formed of poly-silicon and may be formed by a semiconductor process, such as lithography, deposition, or ion implantation.

The liquid crystal layer 25 is formed between the pixel electrode 23 and the common electrode 26, and the liquid crystal layer 25 is filled with the liquid crystal molecules 25a.

Liquid crystals represent an intermediate state between a solid (crystal) and a liquid. Most of the liquid crystal materials are organic compounds, and their molecular shape is a long and thin bar, and may have a crystal form in which the arrangement of the molecules is irregular in one direction, but is regular in another direction. As a result, the liquid crystal has both fluidity of the liquid and optical anisotropy of the crystal (solid).

In addition, liquid crystals also exhibit optical properties according to changes in an electric field. For example, in the liquid crystal, the orientation of molecules forming the liquid crystal may change according to a change in an electric field. When an electric field is generated in the liquid crystal layer 25, the liquid crystal molecules 25a of the liquid crystal layer 25 may be arranged according to the direction of the electric field, and when the electric field is not generated in the liquid crystal layer 25, the liquid crystal molecules 25a may be irregularly arranged or may be arranged along an alignment layer. As a result, the optical properties of the liquid crystal layer 25 may vary depending on the presence or absence of the electric field passing through the liquid crystal layer 25.

A cable 20a configured to transmit image data to the liquid crystal panel and a display driver integrated circuit (DDI) (hereinafter referred to as "driver IC") configured to process digital image data and output an analog image signal are provided at one side of the liquid crystal panel 20.

The cable 20a may electrically connect the control assembly 50 and the power assembly 60 to the panel driver 30, and may also electrically connect the panel driver 30 to the liquid crystal panel 20. The cable 20a may include a flexible flat cable or a film cable that is bendable.

The panel driver 30 may receive image data and power from the control assembly 50 and the power assembly 60 through the cable 20a, and transmit the image data and driving current to the liquid crystal panel 20 through the cable 20a.

In addition, the cable 20a and the panel driver 30 may be integrally implemented as a film cable, a chip on film (COF), or a tape carrier package (TCP). In other words, the panel driver 30 may be disposed on the cable 20a. However, the disclosure is not limited thereto, and the panel driver 30 may be disposed on the liquid crystal panel 20.

The control assembly 50 may include a control circuit configured to control an operation of the liquid crystal panel 20 and the light source apparatus 100. The control circuit may process image data received from an external content source, transmit the image data to the liquid crystal panel 20, and transmit dimming data to the light source apparatus 100.

The power assembly 60 may supply power to the liquid crystal panel 20 and the light source apparatus 100 such that the light source apparatus 100 outputs surface light and the liquid crystal panel 20 blocks or transmits the light of the light source apparatus 100.

The control assembly 50 and the power assembly 60 may be implemented as a printed circuit board and various circuits mounted on the printed circuit board. For example, the power circuit may include a capacitor, a coil, a resistance element, a processor, and a power circuit board on which the capacitor, the coil, the resistance element, and the processor are mounted. Further, the control circuit may include a memory, a processor, and a control circuit board on which the memory and the processor are mounted.

Hereinafter, the light source apparatus 100 will be described.

Figure 4:
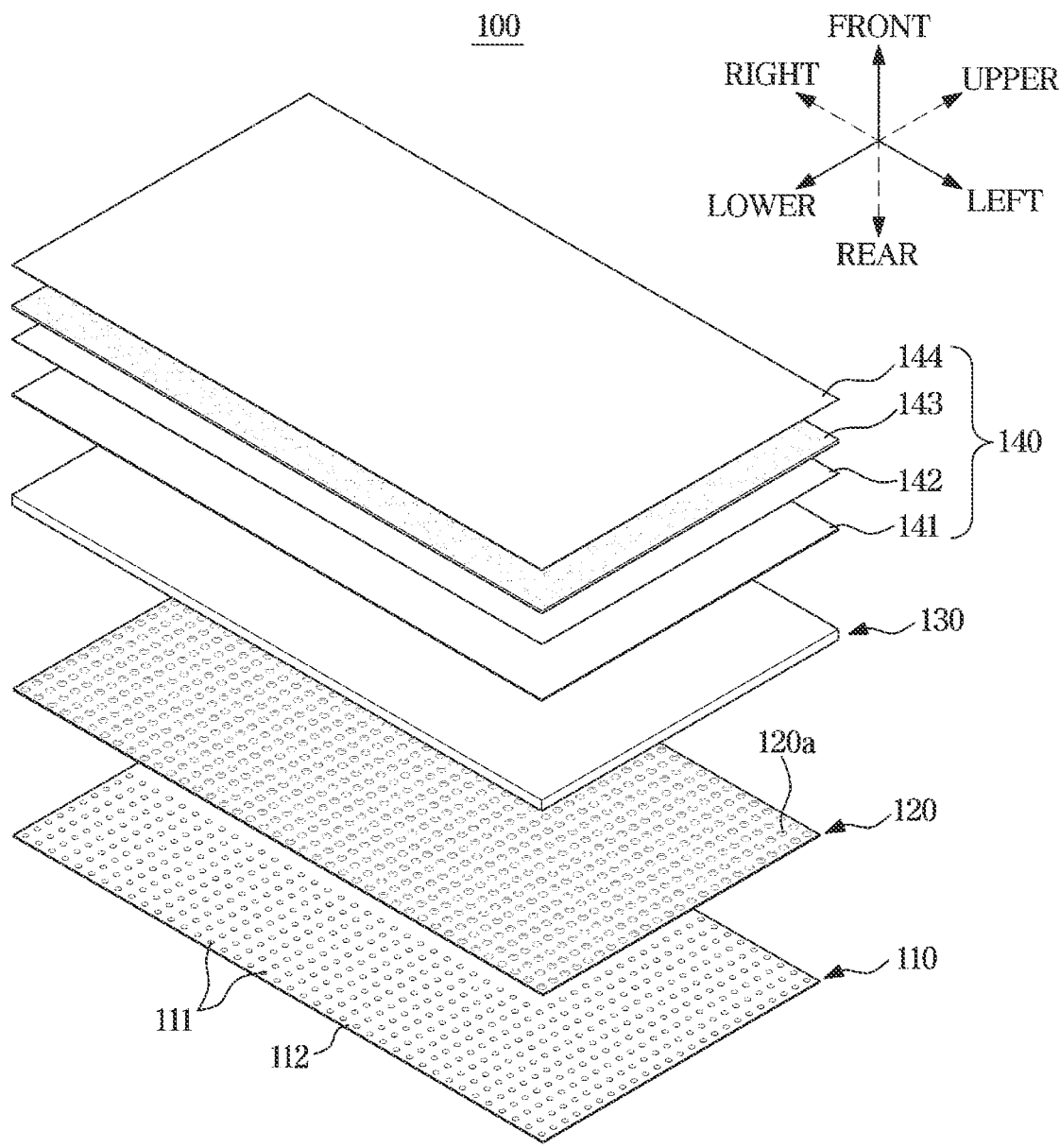
FIG. 4 is an exploded view illustrating a light source apparatus according to an embodiment.
Figure 5:
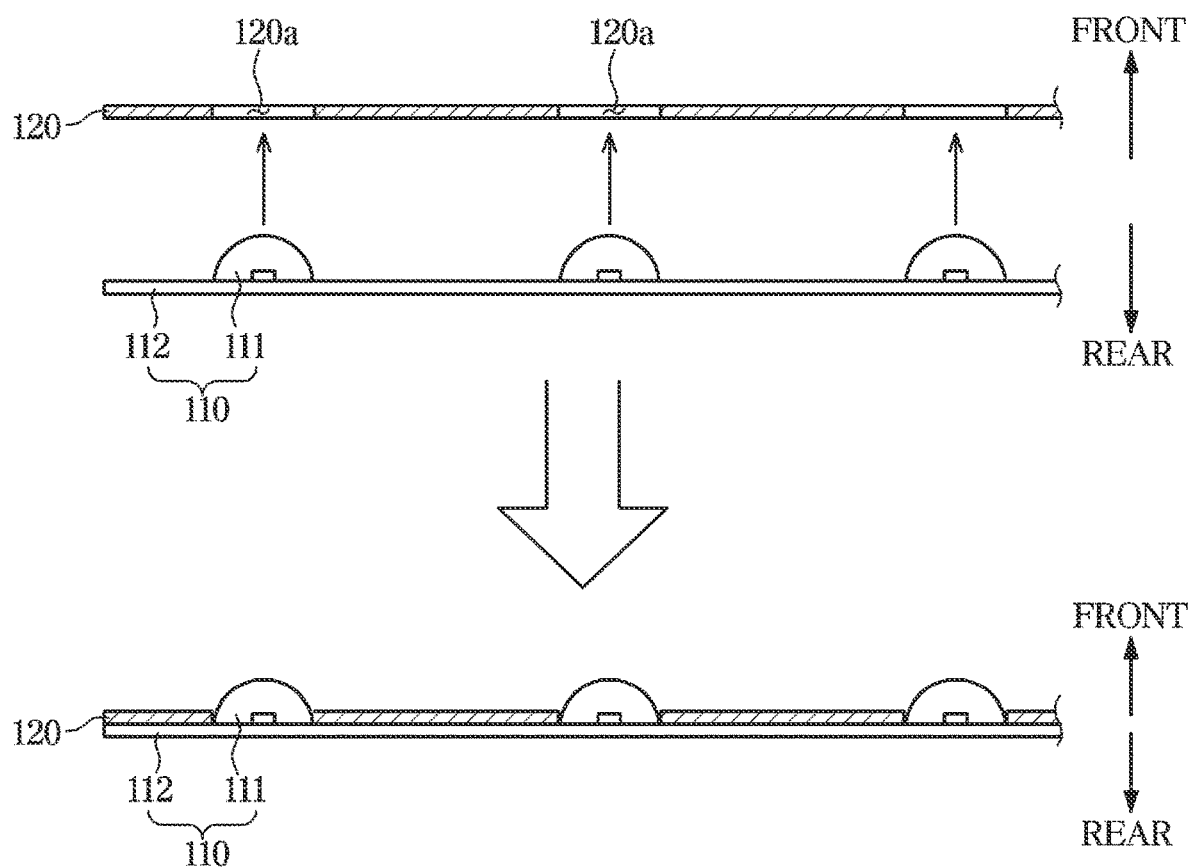
FIG. 5 is a view illustrating a process of combining a light source module and a reflective sheet included in a light source apparatus according to an embodiment.

FIG. 4 is an exploded view illustrating a light source apparatus according to an embodiment. FIG. 5 is a view illustrating a process of combining a light source module and a reflective sheet included in a light source apparatus according to an embodiment.

The light source apparatus 100 may include a light source module 110 configured to generate light, a reflective sheet 120 configured to reflect light, a diffuser plate 130 configured to uniformly diffuse light, and an optical sheet 140 configured to improve a luminance of light that is emitted.

The light source module 110 may include a plurality of light sources 111 configured to emit light, and a substrate 112 provided to support/fix the plurality of light sources 111.

The plurality of light sources 111 may be disposed in a predetermined pattern to allow light to be emitted with uniform luminance. The plurality of light sources 111 may be disposed in such a way that a distance between one light source and light sources adjacent thereto is the same.

For example, as shown in FIG. 4, the plurality of light sources 111 may be arranged in rows and columns. Accordingly, the plurality of light sources may be disposed such that an approximate square is formed by four adjacent light sources. In addition, any one light source may be disposed adjacent to four light sources, and a distance between one light source and four adjacent light sources may be approximately the same.

Alternatively, the plurality of light sources may be arranged in a plurality of rows, and a light source belonging to one of the plurality rows may be disposed at the center of two light sources belonging to rows adjacent to the one row, and thus an approximately equilateral triangle is formed by the three adjacent light sources. In this case, one light source may be disposed adjacent to six light sources, and a distance between one light source and six adjacent light sources may be approximately the same.

However, the pattern in which the plurality of light sources 111 is disposed is not limited to the patterns described above, and the plurality of light sources 111 may be disposed in various patterns to allow light to be emitted with uniform luminance.

The light source 111 may employ an element configured to emit monochromatic light (light of a specific wavelength, for example, blue light) or white light for example light of a mixture of red light, green light, and blue light) in various directions by receiving power. For example, the light source 111 may include LEDs. LEDs may be implemented in various sizes, and may include, for example, Mini LEDs and/or Micro LEDs.

The substrate 112 may fix the plurality of light sources 111 to prevent a change in the position of the light source 111. Further, the substrate 112 may supply power, which is for the light source 111 to emit light, to the light source 111.

The substrate 112 may fix the plurality of light sources 111, and may include a synthetic resin and/or tempered glass and/or a printed circuit board (PCB) on which a conductive power supply line for supplying power to the light source 111 is formed.

The reflective sheet 120 may reflect light emitted from the plurality of light sources 111 to a front side or to a direction close to the front side.

In the reflective sheet 120, a plurality of through holes 120a is formed at positions corresponding to each of the plurality of light sources 111 of the light source module 110. In addition, the light source 111 of the light source module 110 may pass through the through hole 120a and protrude to the front of the reflective sheet 120.

For example, as shown in an upper side in FIG. 5, in a process of assembling the reflective sheet 120 and the light source module 110, the plurality of light sources 111 of the light source module 110 are inserted into the plurality of through holes 120a formed in the reflective sheet 120. Accordingly, as shown in a lower side in FIG. 5, the substrate 112 of the light source module 110 may be located behind the reflective sheet 120, but the plurality of light sources 111 of the light source module 110 may be located in front of the reflective sheet 120.

Accordingly, the plurality of light sources 111 may emit light from the front of the reflective sheet 120.

The plurality of light sources 111 may emit light in various directions from the front of the reflective sheet 120. The light may be emitted toward the diffuser plate 130 from the light sources 111 as well as toward the reflective sheet 120 from the light sources 111, and the reflective sheet 120 may reflect the light emitted toward the reflective sheet 120 toward the diffuser plate 130.

The light emitted from the light sources 111 passes through various objects such as the diffuser plate 130, the optical sheet 140, and the like. When the light passes through the diffuser plate 130 and the optical sheet 140, some of the incident light is reflected from the surfaces of the diffuser plate 130 and the optical sheet 140. The reflective sheet 120 may reflect the light reflected by the diffuser plate 130 and the optical sheet 140.

The diffuser plate 130 may be provided in front of the light source module 110 and the reflective sheet 120, and may evenly distribute the light emitted from the light source 111 of the light source module 110.

As described above, the plurality of light sources 111 is disposed on a rear surface of the light source apparatus 100. Although the plurality of light sources 111 are disposed at equal intervals on the rear surface of the light source apparatus 100, unevenness in luminance may occur depending on the positions of the plurality of light sources 111.

The diffuser plate 130 may allow light emitted from the plurality of light sources 111 to be diffused inside the diffuser plate 130 to remove unevenness in luminance caused by the plurality of light sources 111. In other words, the diffuser plate 130 may uniformly emit uneven light of the plurality of light sources 111 to the front surface.

The optical sheet 140 may include various sheets for improving luminance and luminance uniformity. For example, the optical sheet 140 may include a diffusion sheet 141, a first prism sheet 142, a second prism sheet 143, and a reflective polarization sheet 144.

The diffusion sheet 141 may diffuse light for uniformity of luminance. Light emitted from the light source 111 may be diffused by the diffuser plate 130 and diffused again by the diffusion sheet 141 included in the optical sheet 140.

The first and second prism sheets 142 and 143 may increase luminance by focusing the light diffused by the diffusion sheet 141. The first and second prism sheets 142 and 143 include a prism pattern having a triangular prism shape, and a plurality of the prism patterns are arranged to be adjacent to each other to form a plurality of band shapes.

The reflective polarization sheet 144 is a type of polarization film, and may transmit a portion of the incident light and reflect another portion of the light to improve luminance. For example, light polarized in the same direction as a predetermined polarization direction of the reflective polarization sheet 144 may be transmitted, and light polarized in a direction different from the polarization direction of the reflective polarization sheet 144 may be reflected. Further, the light reflected by the reflective polarization sheet 144 may be recycled in the light source apparatus 100, and such light recycling may allow the luminance of the display apparatus 10 to be improved.

The sheet of film included in the optical sheet 140 is not limited to the sheet or film shown in FIG. 4, and the optical sheet 140 may include more various sheets, such as a protective sheet, or films.

Figure 6:
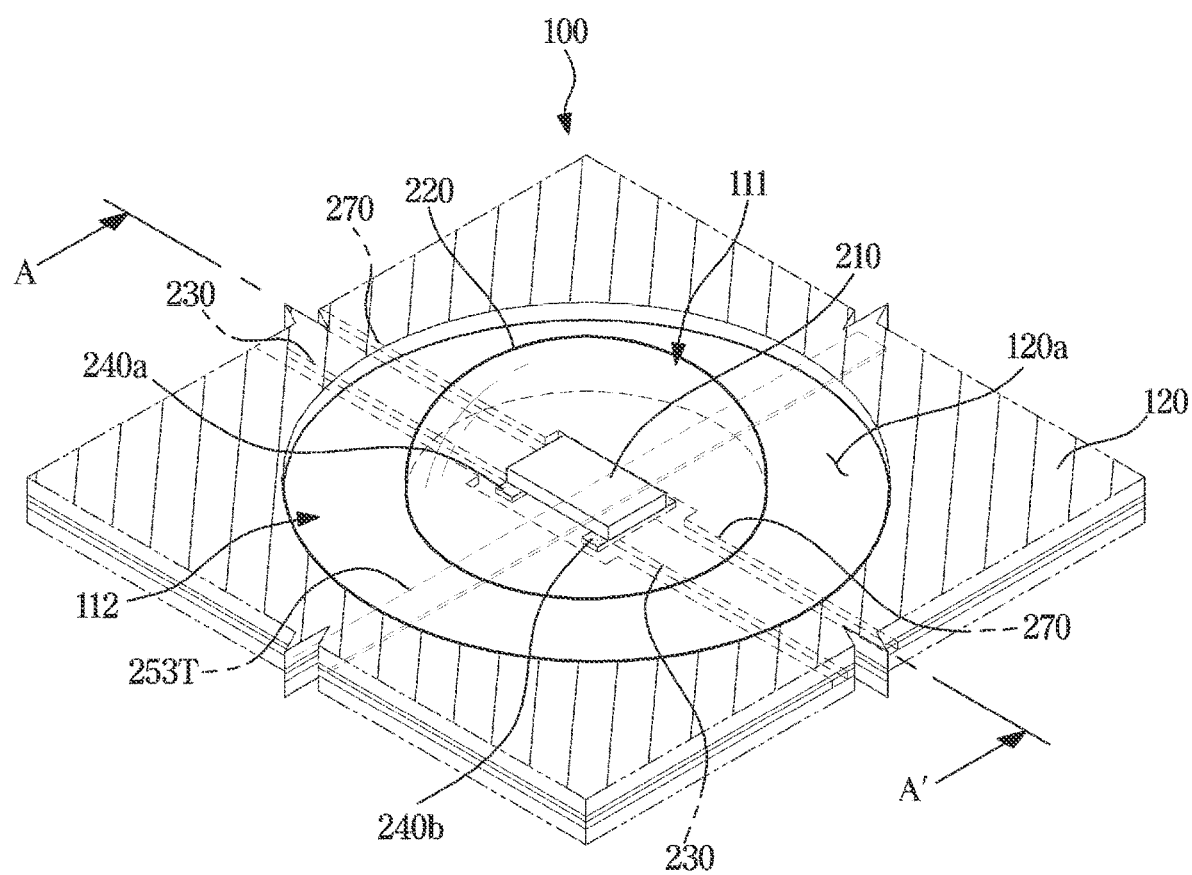
FIG. 6 is a perspective view illustrating a light source included in a light source apparatus according to an embodiment.
Figure 7:
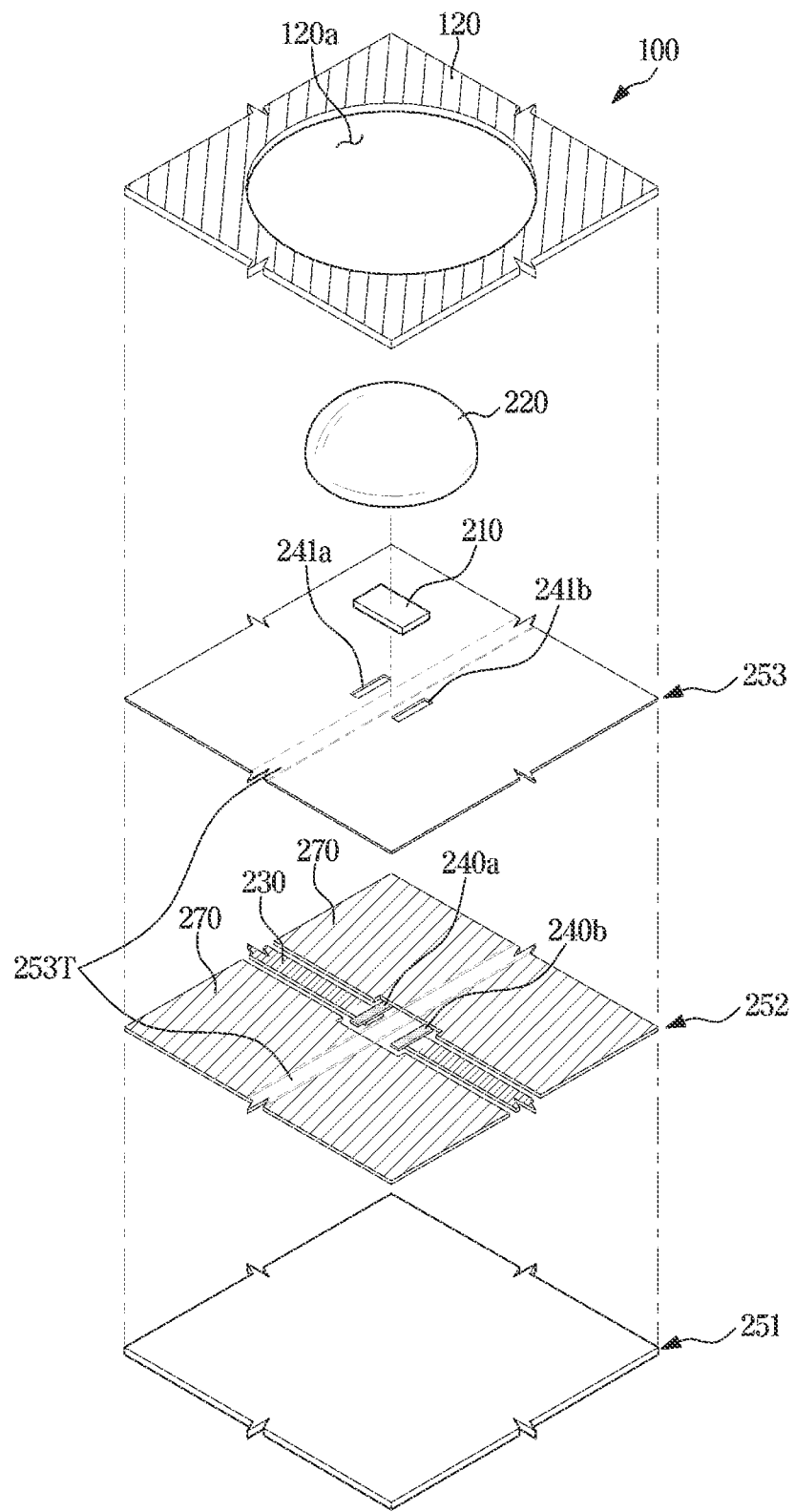
FIG. 7 is an exploded view illustrating the light source shown in FIG. 6.
Figure 8:
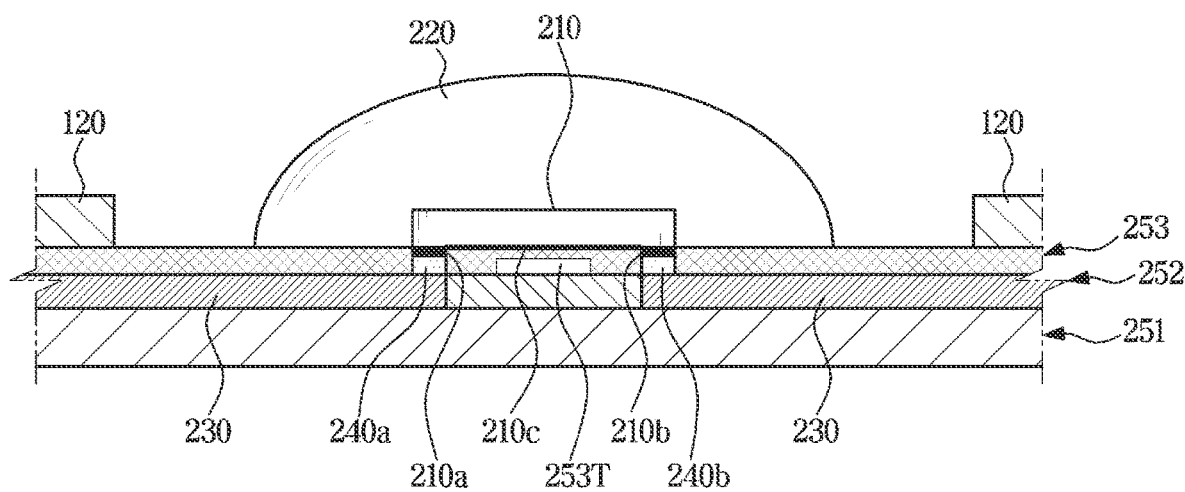
FIG. 8 is a side cross-sectional view taken along line A-A' shown in FIG. 6.

FIG. 6 is a perspective view illustrating a light source included in a light source apparatus according to an embodiment. FIG. 7 is an exploded view illustrating the light source shown in FIG. 6. FIG. 8 is a side cross-sectional view taken along line A-A' shown in FIG. 6.

Referring to FIGS. 6 to 8, as described above, the light source module 110 includes the plurality of light sources 111. The plurality of light sources 111 may pass through the through holes 120a from behind the reflective sheet 120 to protrude to the front of the reflective sheet 120. Accordingly, as shown in FIGS. 6 and 7, the light source 111 and a portion of the substrate 112 may be exposed toward the front of the reflective sheet 120 through the through hole 120a.

The light source 111 may include an electrical/mechanical structure located in a region defined by the through hole 120a of the reflective sheet 120.

Each of the plurality of light sources 111 may include a LED 210 and an optical dome 220.

In order to improve the uniformity of surface light emitted by the light source apparatus 100 and the contrast ratio by local dimming, the number of light sources 111 may be increased. As a result, an area allowed for each of the plurality of light sources 111 may be narrowed.

The LED 210 may include a P-type semiconductor and an N-type semiconductor for emitting light by recombination of holes and electrons. Accordingly, the LED 210 may have a polarity. For example, the polarity of one side (a side of the P-type semiconductor) of the LED 210 may be positive (+), and the polarity of the other side (a side of the N-type semiconductor) of the LED 210 may be negative (−). That is, one side of the LED 210 may be an anode and the other side of the LED 210 may be a cathode.

In addition, the LED 210 may be provided with a pair of electrodes 210a and 210b for supplying holes and electrons to the anode and the cathode, respectively.

The LED 210 may convert electrical energy to optical energy. In other words, the LED 210 may emit light having the maximum intensity at a predetermined wavelength at which power is supplied. For example, the LED 210 may emit blue light having a peak value at a wavelength which represents a blue color (for example, a wavelength between 450 nm to 495 nm).

The LED 210 may be directly attached to the substrate 112 in a chip on board (COB) manner. In other words, the light source 111 may include the LED 210 in which a LED chip or a LED die is directly attached to the substrate 112 without separate packaging.

In order to reduce an area to be occupied by the LED 210, the LED 210 may be manufactured in a flip chip type in which a Zener diode is not included. As for the flip-chip type LED 210, when bonding a LED corresponding to a semiconductor element to the substrate 112, an electrode pattern of the semiconductor element may be fused to the substrate 112 as it is, without using intermediate media, such as a metal lead (wire) or ball grid array (BGA).

Accordingly, because the metal lead (wire) or the ball grid array is omitted, the light source 111 including the flip-chip type LED 210 may be provided in a miniature structure.

In order to miniaturize the light source 111, the light source module 110 may be manufactured such that a flip-chip type LED 210 is attached to the substrate 112 in a chip on board manner.

A feeding line 230 and a feeding pad 240 may be provided on the substrate 112 to supply power to the LED 210 provided in a flip chip type.

The feeding line 230 may be provided on the substrate 112 to supply electrical signals and/or power from the control assembly 50 and/or the power assembly 60 to the LED 210.

As shown in FIGS. 6 and 8, the substrate 112 may be formed by alternately stacking a non-conductive insulation layer 251 and a conductive conduction layer 252.

A line or pattern through which power and/or an electrical signal passes is formed in the conduction layer 252. The conduction layer 252 may be formed of various materials having electrical conductivity. For example, the conduction layer 252 may be formed of various metal materials, such as copper (Cu), tin (Sn), aluminum (Al), an alloy thereof, and the like. The conductive layer 252 may include synthetic resin and/or tempered glass and/or a printed circuit board (PCB) on which a conductive power supply line for supplying power to the light source 111 is formed.

A dielectric of the insulation layer 251 may insulate between the lines or patterns of the conduction layer 252. The insulation layer 251 may be formed of a dielectric for electrical insulation, for example, FR-4.

The feeding line 230 may be implemented by the line or pattern formed on the conduction layer 252.

The feeding line 230 may be electrically connected to the LED 210 through feeding pads 240a and 240b.

A charge neutralization line 270 may provide a path for current of electrostatic discharge generated in the vicinity of the optical dome 220. In other words, the charge neutralization line 270 may guide charges caused by electrostatic discharge to flow to the ground. The charge neutralization line 270 may be formed of the same material as that of the feeding line 230. For example, the charge neutralization line 270 may be formed of various metal materials, such as copper (Cu), tin (Sn), aluminum (Al), or an alloy thereof.

The feeding pads 240a and 240b may include a first feeding pad 240a provided to be in contact with the N-type semiconductor constituting the LED 210 and a second feeding pad 240b provided to be in contact with the P-type semiconductor constituting the LED 210.

The feeding pads 240a and 240b may be formed by exposing the feeding line 230 to the outside. According to various embodiments, the feeding pads 240a and 240b may be implemented in a rectangular parallelepiped shape and/or a regular hexahedral shape.

A protective layer 253 configured to prevent or suppress damage due to an external impact, damage due to a chemical action (for example, corrosion or the like), and/or damage due to an optical action may be formed on the outermost side on the substrate 112. The protective layer 253 may include a photo solder resist (PSR).

As shown in FIGS. 6 and 8, the protective layer 253 may cover the feeding line 230 to prevent the feeding line 230 from being exposed to the outside.

The protective layer 253 may have windows 241a and 241b that expose a portion of the feeding line 230 to the outside for electrical contact between the feeding line 230 and the LED 210. The portion of the feeding line 230 exposed to the outside by the windows 241a and 241b of the protective layer 253 may form the feeding pads 240a and 240b. The windows 241a and 241b may refer a type of a hole or gap formed in the protective layer 253.

The windows 241a and 241b of the protective layer 253 may include a first window 241a exposing the first feeding pad 240a to the outside and a second window 241b exposing the second feeding pad 240b to the outside.

The feeding pads 240a and 240b may be coated with a conductive adhesive material for electrical contact between the feeding line 230 exposed to the outside and the electrodes 210a and 210b of the LED 210. The conductive adhesive material may be applied to the inside of the windows 241a and 241b of the protective layer 253.

The electrodes 210a and 210b of the LED 210 may come into contact with the conductive adhesive material, and the LED may be electrically connected to the feeding pads 240a and 240b through the conductive adhesive material.

The conductive adhesive material may include, for example, solder having electrical conductivity. However, the present disclosure is not limited thereto, and the conductive adhesive material may include electrically conductive epoxy adhesives.

Power may be supplied to the LED 210 through the feeding line 230 and the feeding pads 240a and 240b, and when the power is supplied, the LED 210 may emit light.

For example, a driving voltage may be supplied to the first electrode 210a through the first feeding pad 240a, and electrons moved from the anode (the N-type semiconductor) to the cathode (the P-type semiconductor) of the LED by the driving voltage may be moved to the second feeding pad 240b through the second electrode 210b.

That is, a pair of feeding pads 240a and 240b respectively corresponding to a pair of electrodes 210a and 210b provided in the flip-chip type LED 210 may be provided.

Meanwhile, the shape of the LED 210 may be a rectangular parallelepiped and/or a regular hexahedron, but the shape of the LED 210 is not limited thereto.

As described above, the lower surface of the LED 210 may be in contact with the first feeding pad 240a and the second feeding pad 240b. For example, the lower surface of the LED 210 may be in contact with the first feeding pad 240a and the second feeding pad 240b by the conductive adhesive material.

The first electrode 210a may refer to a contact area (hereinafter referred to as a "first contact area") between the LED 210 and the first feeding pad 240a and the second electrode 210b may refer to a contact area (hereinafter referred to as a "second contact area") between the LED 210 and the second feeding pad 240b.

On the lower surface of the LED 210, an area 210c (hereinafter referred to as "non-contact area") other than the first contact area 210a and the second contact area 210b may not be in contact with the feeding pads 240a and 240b.

The non-contact area 210c other than the first contact area 210a and the second contact area 210b on the lower surface of the LED 210 may be in contact with the protective layer 253.

That is, a hole or gap may not be formed between the first window 241a and the second window 241b of the protective layer 253.

The optical dome 220 may cover the LED 210. The optical dome 220 may prevent or suppress damages to the LED 210 caused by an external mechanical action and/or damage to the LED 210 caused by a chemical action.

The optical dome 220 may have a dome shape formed in such a way that a sphere is cut into a surface not including the center thereof, or may have a hemispherical shape in such a way that a sphere is cut into a surface including the center thereof. A vertical cross section of the optical dome 220 may be an arc shape or a semicircle shape.

The optical dome 220 may be formed of silicone or epoxy resin. For example, the molten silicon or epoxy resin may be discharged onto the LED 210 through a nozzle, and the discharged silicon or epoxy resin may be cured, thereby forming the optical dome 220.

Accordingly, the shape of the optical dome 220 may vary depending on the viscosity of the liquid silicone or epoxy resin. For example, in a state in which the optical dome 220 is manufactured using silicon having a thixotropic index of about 2.7 to 3.3 (appropriately, 3.0), the optical dome 220 may include a dome ratio, indicating a ratio of a height of a dome to a diameter of a base of the dome (the height of the dome/a diameter of the base), of approximately 2.5 to 3.1 (appropriately 2.8). For example, the optical dome 220 formed of silicon having a thixotropic index of about 2.7 to 3.3 (appropriately 3.0) may have a diameter of a base of about 2.5 mm and a height of about 0.7 mm.

The optical dome 220 may be optically transparent or translucent. Light emitted from the LED 210 may be emitted to the outside by passing through the optical dome 220.

In this case, the dome-shaped optical dome 220 may refract light like a lens. For example, light emitted from the LED 210 may be refracted by the optical dome 220 and thus may be dispersed.

As described above, the optical dome 220 may protect the LED 210 from an external mechanical action, chemical action, or electrical action, as well as dispersing light emitted from the LED 210.

Figure 9:
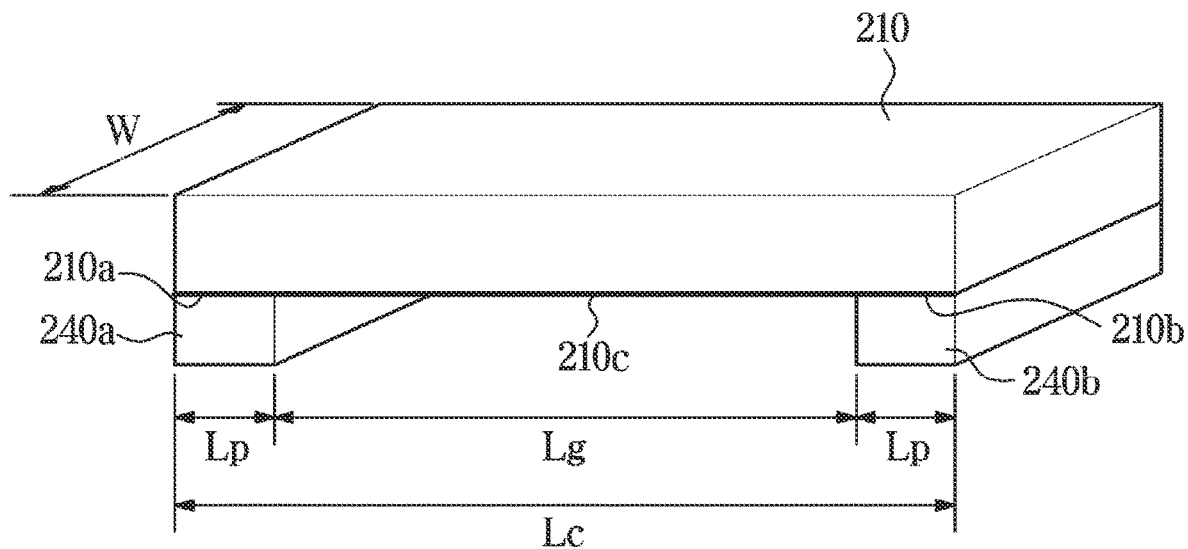
FIG. 9 is a view illustrating a relationship between a light emitting diode and a feeding pad included in a light source apparatus according to an embodiment.

FIG. 9 is a view illustrating a relationship between a LED and a feeding pad included in a light source apparatus according to an embodiment.

Referring to FIG. 9, as described above, the LED 210 may be in contact with the feeding pads 240a and 240b through a conductive adhesive material.

According to various embodiments, a length Lp of the first contact area 210a and a length Lp of the second contact area 210b may be the same as each other with respect to a length direction of the LED 210, but as long as satisfying conditions described below, the length Lp of the first contact area 210a and the length Lp of the second contact area 210b may be designed to be different from each other.

The length direction of the LED 210 refers to the direction along a longer side among four sides forming a bottom surface of a rectangular parallelepiped.

The LED 210 may have a length Lc longer than a width W. For example, the length Lc of the LED 210 may be twice or more than the width W.

The length Lp of the first contact area 210a and the length Lp of the second contact area 210b may correspond to the length of the first feeding pad 240a and the length of the second feeding pad 240b, respectively, with respect to the length direction of the LED 210.

According to various embodiments, each of the length Lp of the first contact area 210a and the length Lp of the second contact area 210b with respect to the length direction of the LED 210 may be shorter than the length Lg of the non-contact area 210c.

Accordingly, each of the length Lp of the first feeding pad 240a and the length Lp of the second feeding pad 240b may be shorter than the length Lg of the non-contact area 210c with respect to the length direction of the LED 210.

Since the width of the first contact area 210*a*, the second contact area 210*b*, and the non-contact area 210*c* are equal or similar to the width W of the LED 210, each of the first contact area 210*a* and the second contact area 210*b* may be smaller than the non-contact area 210*c* excluding the first contact area 210*a* and the second contact area 210*b* on the lower surface of the LED 210.

According to the conventional technology, the length of the first feeding pad and the length of the second feeding pad have been formed longer than the length of the non-contact area for design convenience and stability. Accordingly, only very small wire or no wire may pass through a space between the first feeding pad and the second feeding pad.

On the other hand, according to the present disclosure, since the length Lg of the non-contact area 210*c* is designed to be longer than the length Lp of the first feeding pad 240*a* or the length Lp of the second feeding pad 240*b*, various types of wires may pass between the first feeding pad 240*a* and the second feeding pad 240*b*.

That is, according to the present disclosure, since the length Lg of the non-contact area 210*c* is designed to be longer than the length Lp of the first contact area 210*a* or the length Lp of the second contact area 210*b*, various types of wires may pass through a lower side of the non-contact area 210*c*.

Meanwhile, according to various embodiments, the sum of the length Lp of the first contact area 210*a* and the length Lp of the second contact area 210*b* may be shorter than the length Lg of the non-contact area 210*c*. When the sum of the length Lp of the first contact area 210*a* and the length Lp of the second contact area 210*b* is shorter than the length Lg of the non-contact area 210*c*, a larger wire may pass through the lower side of the non-contact area 210*c*.

Figure 10:
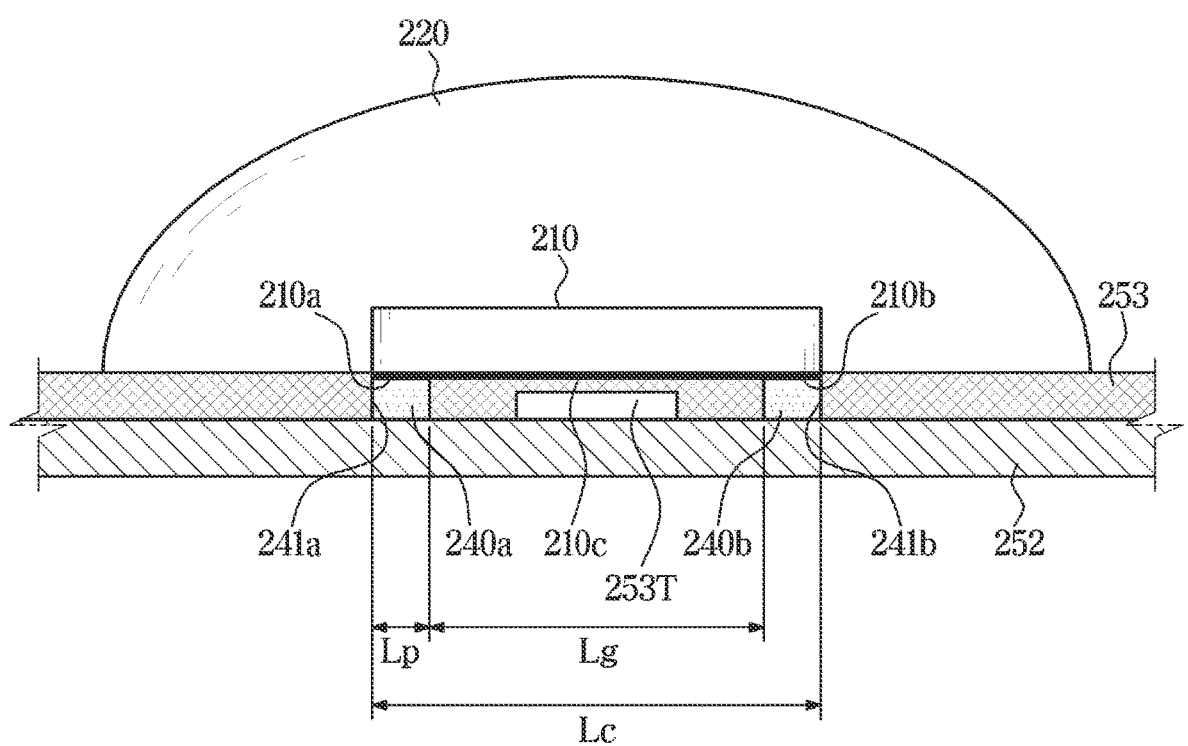
FIG. 10 is a view specifically illustrating the side cross section taken along line A-A' shown in FIG. 6.

FIG. 10 is a view specifically illustrating the side cross section taken along line A-A' shown in FIG. 6.

Referring to FIG. 10, the feeding pads 240*a* and 240*b* may be provided on the conductive layer 252, and the protective layer 253 may cover the conductive layer 252. In this case, the feeding pads 240*a* and 240*b* provided on the conductive layer 252 may be exposed to the outside through the windows 241*a* and 241*b* of the protective layer 253.

As described with reference to FIG. 9, since the length of the first contact area 210*a* is shorter than the length of the non-contact area 210*c* with respect to the length direction of the LED 210, the length of the first window 241*a* may also be shorter than the length of the non-contact area 210*c*. Similarly, the length of the second window 241*b* may also be shorter than the length of the non-contact area 210*c*.

That is, each of the length of the first window 241*a* and the length of the second window 241*b* may be shorter than the distance between the first window 241*a* and the second window 241*b*.

According to various embodiments, the sum of the length of the first window 241*a* and the length of the second window 241*b* may also be shorter than the distance between the first window 241*a* and the second window 241*b*.

According to the present disclosure, the lengths of the windows 241*a* and 241*b* of the protective layer 253 may be designed to correspond to the lengths of the feeding pads 240*a* and 240*b* according to the embodiment and thus a space between the first window 241*a* and the second window 241*b* may be utilized.

For example, the protective layer 253 may include a tunnel 253T provided between the first window 241*a* and the second window 241*b* and extending in a width direction of the LED 210.

The conductive layer 252 may further include a barrier wall for separating the feeding line 230 and/or the charge neutralization line 270 from a wire passing through the tunnel 253T. That is, the conductive layer 252 may include the barrier wall corresponding to the tunnel 253T to secure a space separated from the feeding line 230 and/or the charge neutralization line 270, and various types of wires may pass through the separated space.

A wire passing through the tunnel 253T may not electrically contact the conductive layer 252, the feeding line 230 and/or the charge neutralization line 270.

The width direction of the LED 210 refers to a direction along a shorter side among four sides forming the bottom surface of the LED 210.

The bottom surface of the tunnel 253T extending in the width direction of the LED 210 may be the conductive layer 252.

Accordingly, wires (e.g., lines and/or patterns) formed on the conductive layer 252 may pass through the tunnel 253T.

From the perspective of the tunnel 253T extending in the width direction of the LED 210, surfaces other than the bottom surface of the tunnel 253T may be a photo solder resist (PSR), which is a component of the protective layer 253.

That is, wires passing through the tunnel 253T may be prevented from coming in contact with the LED 210 by the protective layer 253. Accordingly, various electrical signals passing through the wires may not affect driving of the LED 210.

On the other hand, the tunnel 253T may be provided in various shapes without limitation as long as it can allow wires to pass therethrough.

According to various embodiments, with respect to the length direction of the LED 210, the length of the tunnel 253T may be shorter than the length of the non-contact area 210*c*. Accordingly, various electrical signals passing through the wires may not affect the feeding pads 240*a* and 240*b*.

According to the present disclosure, since the lower portion of the non-contact area 210*c* of the LED 210 is utilized as a passage for wires, the degree of freedom in wiring design may be improved. Therefore, according to the present disclosure, restrictions on physical space for wiring design may be alleviated.

In the description above, a structure of the light source 111 has been described from the perspective of a single light source 111.

As described above, the light source apparatus 100 includes a plurality of light sources 111, and the following description will be made in relation to a structure of the plurality of light sources 111 from the perspective of the light source module 110.

Figure 11:
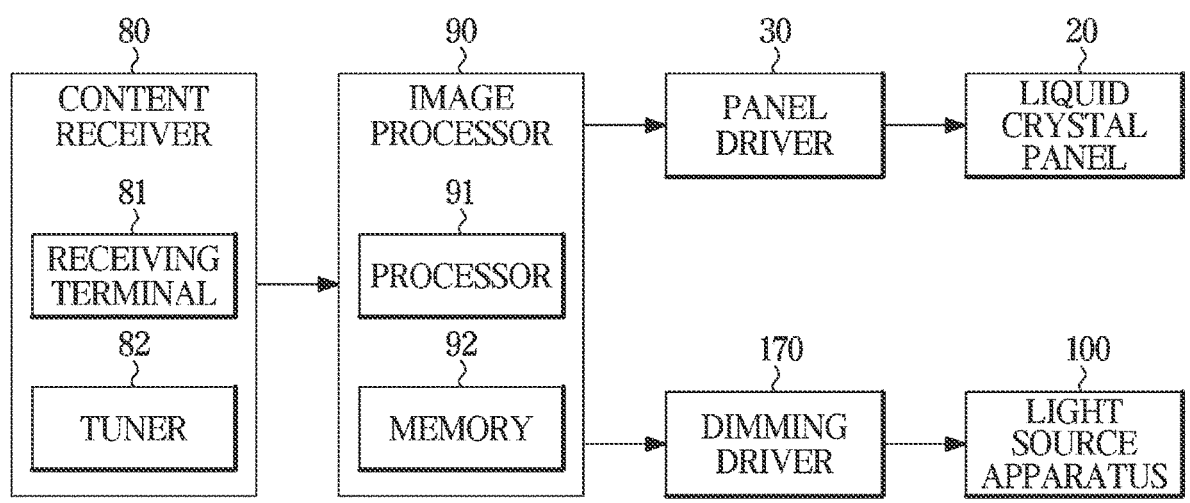
FIG. 11 is a view illustrating a configuration of a display apparatus according to an embodiment.
Figure 12:
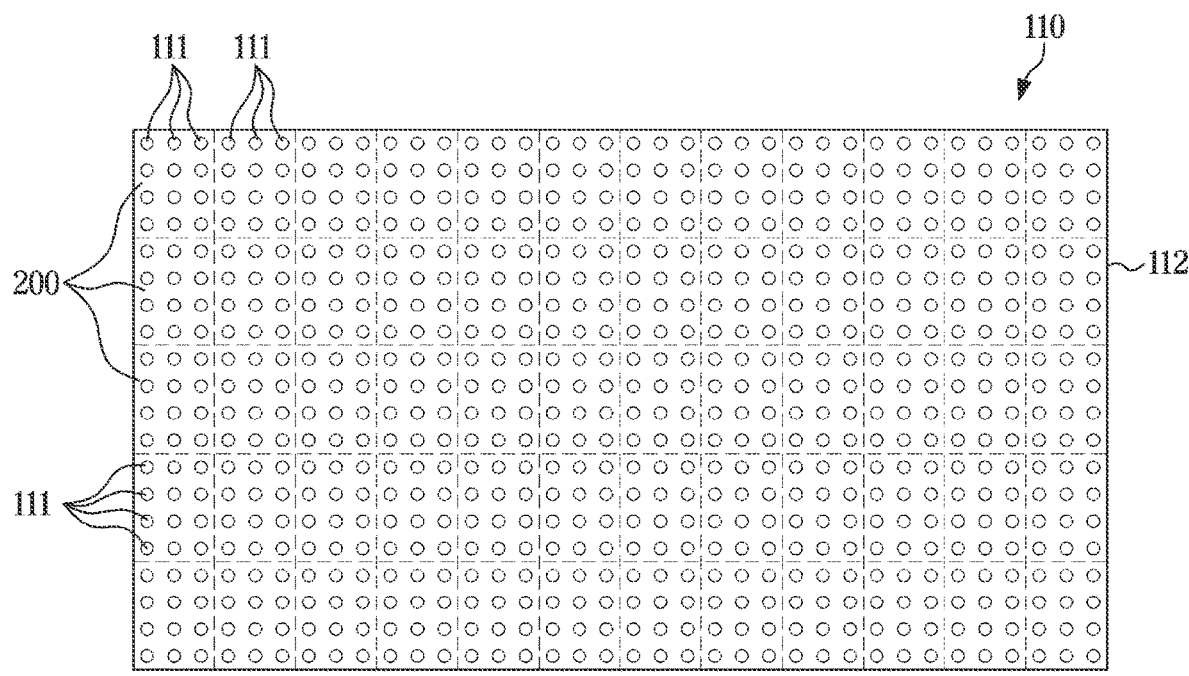
FIG. 12 is a view illustrating dimming blocks of a light source apparatus included in a display apparatus according to an embodiment.

FIG. 11 is a view illustrating a configuration of a display apparatus according to an embodiment, and FIG. 12 is a view illustrating dimming blocks of a light source apparatus included in a display apparatus according to an embodiment.

As shown in FIG. 11, the display apparatus 10 may include a content receiver 80, an image processor 90, a panel driver 30, the liquid crystal panel 20, a dimming driver 170, and the light source apparatus 100.

The content receiver 80 may include a receiving terminal 81 provided to receive a content including a video signal and/or an audio signal from content sources, and a tuner 82.

The receiving terminal 81 may receive a video signal and an audio signal from content sources through a cable. For example, the receiving terminal 81 may include a component (YPbPr/RGB) terminal, a composite (composite video blanking and sync, CVBS) terminal, an audio terminal, a high-definition multimedia interface (HDMI) terminal, and a universal serial bus (USB) terminal.

The tuner 82 may receive a broadcast signal from a broadcast reception antenna or a wired cable and may extract a broadcast signal of a channel selected by a user from among the broadcast signals. For example, among a plurality of broadcast signals received through the broadcast reception antenna or the wired cable, the tuner 82 may transmit a broadcast signal having a frequency corresponding to a channel selected by a user, and may block a broadcast signal having other frequencies.

As mentioned above, the content receiver 80 may receive a video signal and an audio signal from the content sources through the receiving terminal 81 and/or the tuner 82, and may output the video signal and/or audio signal received through the receiving terminal 81 and/or the tuner 82 to the image processor 90.

The image processor 90 includes a processor 91 configured to process image data, and a memory 92 configured to memorize/store data.

The memory 92 may store programs and data for processing a video signal and/or an audio signal, and temporarily memorize data generated in processing of a video signal and/or an audio signal.

The memory 92 may include a non-volatile memory such as a Read Only Memory (ROM) and a flash memory, and a volatile memory such as a Static Random Access Memory (S-RAM), and a Dynamic Random Access Memory (D-RAM).

The processor 91 may receive a video signal and/or an audio signal from the content receiver 80, and may decode the video signal into image data. The processor 91 may generate dimming data from image data. The processor 91 may output image data and dimming data to the panel driver 30 and the dimming driver 170, respectively.

The display apparatus 10 may perform an operation for improving a contrast ratio of an image.

As described above, the light source apparatus 100 may include the plurality of light sources 111 configured to emit light, and may diffuse light emitted from the plurality of light sources 111, thereby outputting surface light. The liquid crystal panel 20 may include a plurality of pixels, and may control the plurality of pixels to allow the plurality of pixels to individually transmit or block light. An image may be formed by light that passes through each of the plurality of pixels.

In this case, in order to darken a dark part of an image, the light source apparatus 100 may turn off the light sources of the light source apparatus 100 corresponding to the dark part of the image. Accordingly, a contrast ratio of the image may be improved.

As such, an operation of the display apparatus 10 controlling the light source apparatus 100 not to emit light in a region corresponding to a dark part of the image is hereinafter referred to as "local dimming".

For the local dimming, the plurality of light sources 111 included in the light source module 110 may be divided into a plurality of dimming blocks 200 as shown in FIG. 12. FIG. 12 illustrates a total of 60 dimming blocks in five rows and twelve columns, but the number and arrangement of dimming blocks are not limited to those shown in FIG. 12.

Referring to FIG. 12, each of the plurality of dimming blocks 200 may include at least one light source 111. The light source apparatus 100 may supply the same driving current to light sources included in the same dimming block, and the light sources included in the same dimming block may emit light of the same brightness.

In addition, the light source apparatus 100 may supply different driving currents to light sources belonging to different dimming blocks according to dimming data, and the light sources belonging to the different dimming blocks may emit light of different brightness.

Each of the plurality of dimming blocks 200 may include, for example, N×M light sources arranged in an N×M matrix form (N and M are natural numbers). An N×M matrix refers to a matrix with N rows and M columns.

Since each of the light sources includes a LED 210, each of the plurality of dimming blocks 200 may include N×M LEDs 210.

The plurality of dimming blocks 200 may be disposed on the substrate 112. That is, the N×M LEDs 210 may be disposed on the substrate 112.

The processor 91 may provide dimming data for the local dimming to the light source apparatus 100. The dimming data may include information about a luminance of each of the plurality of dimming blocks 200. For example, the dimming data may include information about intensity of light outputted by light sources included in each of the plurality of dimming blocks 200.

The processor 91 may obtain dimming data from image data decoded from a video signal.

The processor 91 may convert image data into dimming data in various ways. For example, the processor 91 may divide an image I, based on the image data, into a plurality of image blocks. The number of the plurality of image blocks may be the same as the number of the plurality of dimming blocks 200, and each of the plurality of image blocks may correspond to each of the plurality of dimming blocks 200.

The processor 91 may obtain luminance values of the plurality of dimming blocks 200 from the image data of the plurality of image blocks. In addition, the processor 91 may generate dimming data by combining the luminance values of the plurality of dimming blocks 200.

For example, the processor 91 may obtain a luminance value of each of the plurality of dimming blocks 200 based on a maximum value among luminance values of pixels included in each of the image blocks.

One image block may include a plurality of pixels, and image data of the one image block may include image data (for example, red data, green data, blue data, etc.) of the plurality of pixels. The processor 91 may calculate a luminance value of each of the pixels based on the image data of each of the pixels.

The processor 91 may determine a maximum value, among luminance values of pixels included in an image block, as a luminance value of a dimming block corresponding to the image block. For example, the processor 91 may determine a maximum value, among luminance values of pixels included in a first image block, as a luminance value of a first dimming block, and determine a maximum value, among luminance values of pixels included in a second image block, as a luminance value of a second dimming block.

The processor 91 may generate dimming data by combining luminance values of the plurality of dimming blocks 200.

As described above, the image processor 90 may decode a video signal obtained by the content receiver 80 into image data, and generate dimming data from the image data. Further, the image processor 90 may transmit image data and dimming data to the liquid crystal panel 20 and the light source apparatus 100, respectively.

The liquid crystal panel 20 includes the plurality of pixels configured to transmit or block light, and the plurality of pixels is disposed in a matrix form. In other words, the plurality of pixels may be arranged in a plurality of rows and a plurality of columns.

The panel driver 30 may receive image data from the image processor and drive the liquid crystal panel 20 according to the image data. In other words, the panel driver 30 may convert image data that is a digital signal (hereinafter referred to as "digital image data") to an analog image signal that is an analog voltage signal, and provide the analog image signal to the liquid crystal panel 20. Optical properties (for example, light transmittance) of the plurality of pixels included in the liquid crystal panel 20 may vary according to the analog image signal.

The panel driver 30 may include a timing controller, a data driver, and a scan driver.

The timing controller may receive image data from the image processor and output image data and a driving control signal to the data driver and the scan driver. The driving control signal may include a scan control signal and a data control signal, and the scan control signal and the data control signal may be used to control the operation of the scan driver and the operation of the data driver, respectively.

The scan driver may receive a scan control signal from the timing controller, and in response to the scan control signal, the scan driver may activate an input of any one row among a plurality of rows in the liquid crystal panel 20. In other words, the scan driver may convert pixels, which is included in one row among a plurality of pixels arranged in the plurality of rows and the plurality of columns, into a state capable of receiving an analog image signal. In this case, pixels other than the pixels in which an input is activated by the scan driver, may not receive an analog image signal.

The data driver may receive image data and a data control signal from the timing controller, and in response to the data control signal, the data driver may output image data on the liquid crystal panel 20. For example, the data driver may receive digital image data from the timing controller, and convert digital image data into an analog image signal. In addition, the data driver may provide an analog image signal to pixels that are included in one row and input-activated by the scan driver. In this case, the pixels in which an input is activated by the scan driver may receive an analog image signal, and optical properties (for example, light transmittance) of pixels in which the input is activated may be changed according to the received analog image signal.

As mentioned above, the panel driver 30 may drive the liquid crystal panel 20 according to image data. Accordingly, an image corresponding to the image data may be displayed on the liquid crystal panel 20.

The dimming driver 170 may receive dimming data from the image processor 90, and drive the light source apparatus 100 according to the dimming data. The dimming data may include information about a luminance of each of the plurality of dimming blocks 200 or information about a brightness of the light sources included in the plurality of dimming blocks 200.

The dimming driver 170 may convert dimming data (hereinafter referred to as "digital dimming data"), which is a digital signal, into an analog dimming signal, which is an analog voltage signal, and provide the analog dimming signal to the light source apparatus 100. According to the analog dimming signal, the intensity of light emitted from the light sources 111 included in each of the plurality of diming blocks 200 may be changed.

In particular, the dimming driver 170 may not directly provide an analog dimming signal to each of the plurality of dimming blocks 200, but may sequentially provide an analog dimming signal to the plurality of dimming blocks 200 in an active matrix manner.

As described above, the plurality of dimming blocks 200 may be arranged in a matrix form in the light source apparatus 100. In other words, the plurality of dimming blocks 200 may be arranged in a plurality of rows and a plurality of columns in the light source apparatus 100.

The dimming driver 170 may sequentially provide an analog dimming signal to dimming blocks belonging to each of a plurality of rows or sequentially provide an analog dimming signal to dimming blocks belonging to each of a plurality of columns.

For example, the dimming driver 170 may input-activate dimming blocks belonging to any one row of the plurality of dimming blocks 200 and provide an analog dimming signal to the input-activated dimming blocks. Then, the dimming driver 170 may input-activate dimming blocks belonging to another row of the plurality of dimming blocks 200 and provide an analog dimming signal to the input-activated dimming blocks.

A case in which the dimming driver 170 sequentially provides an analog dimming signal to the plurality of dimming blocks 200 in the active-matrix method will be described in more detail.

Figure 13:
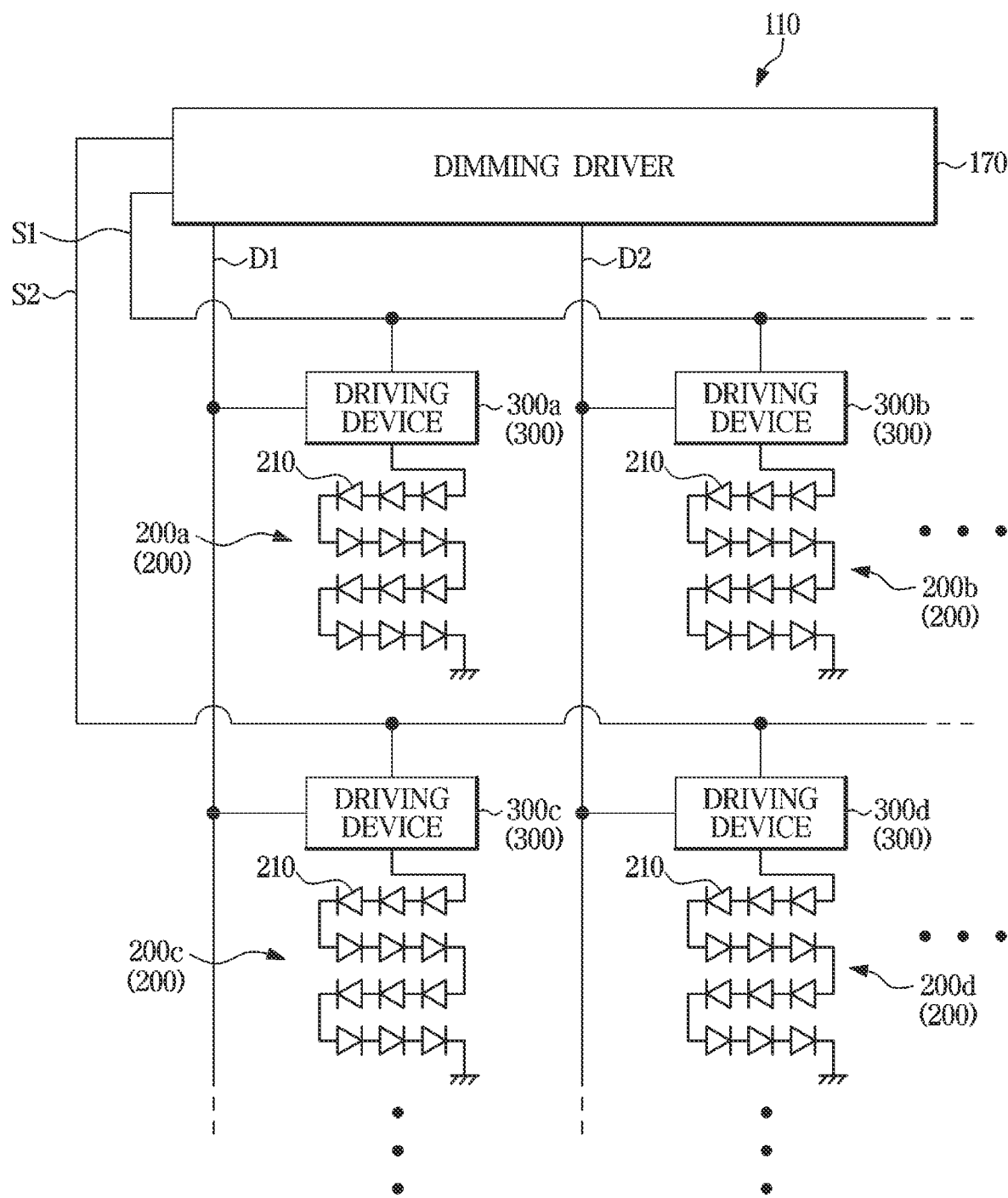
FIG. 13 is a view illustrating an example of a dimming driver and a light source apparatus included in a display apparatus according to an embodiment.
Figure 14:
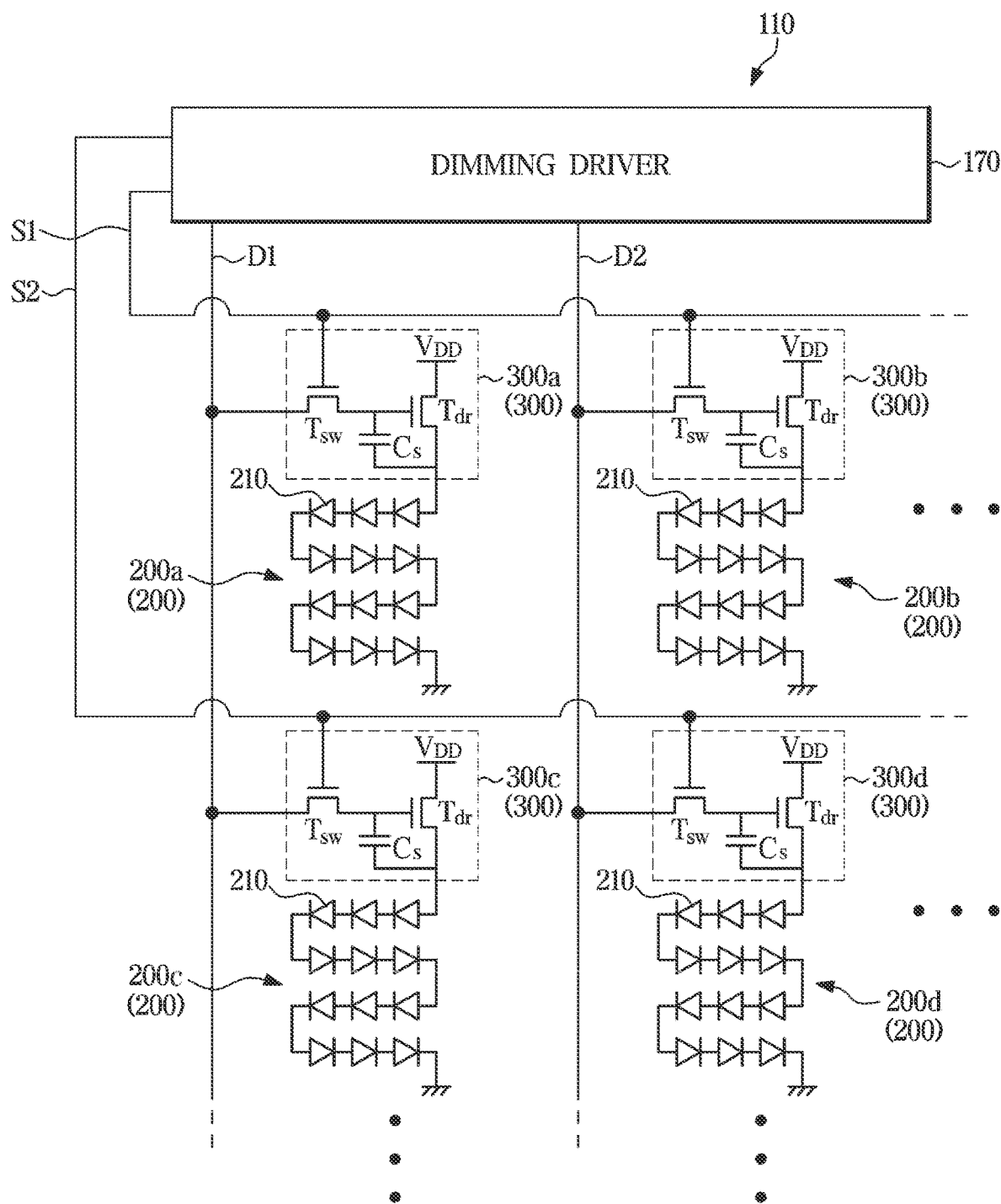
FIG. 14 is a view illustrating an example of a driving device included in a display apparatus according to an embodiment.

FIG. 13 is a view illustrating an example of a dimming driver and a light source apparatus 100 included in a display apparatus according to an embodiment, and FIG. 14 is a view illustrating an example of a driving device included in a display apparatus according to an embodiment.

Referring to FIGS. 13 and 14, the display apparatus 10 includes a dimming driver 170, a plurality of driving devices 300; 300a, 300b, 300c, and 300d, and a plurality of light sources 111.

The plurality of light sources 111 may each include N*M LEDs 210 and may be divided into a plurality of dimming blocks 200 each. For example, a plurality of light sources included in the same dimming block may form one group.

The plurality of driving devices 300 may receive an analog dimming signal from the dimming driver 170, and supply a driving current to the plurality of diming blocks 200 in response to the received analog dimming signal.

A plurality of LEDs 210 included in one dimming block 200 may receive a current from the same driving device 300. For example, a plurality of LEDs 210 included in a first dimming block 200a may receive a driving current from a first driving device 300a, a plurality of LEDs 210 included in a second dimming block 200b may receive a driving current from a second driving device 300b, a plurality of LEDs 210 included in a third dimming block 200c may receive a driving current from a third driving device 300c, and a plurality of LEDs 210 included in a fourth dimming block 200d may receive a driving current from a fourth driving device 300d. In the same way, a plurality of LEDs 210 included in a kth dimming block (k is a natural number) may receive a driving current from a kth driving device.

Accordingly, light sources included in one dimming block 200 may be supplied with a driving current of the same magnitude, and the light sources included in the one dimming block 200 may emit light of the same intensity.

The light sources included in the one dimming block 200 may be connected in series with each other.

For example, assuming that one dimming block 200 includes a first LED, a second LED, a third LED, and a fourth LED, the anode of the first LED may be connected to the driving device, the cathode of the first LED may be connected to the anode of the second LED, the cathode of the second LED may be connected to the anode of the third LED, and the cathode of the third LED may be connected to the anode of the fourth LED, and the cathode of the fourth LED may be connected to the ground.

While an input is activated by the dimming driver 170, the driving devices 300 may receive an analog dimming signal from the dimming driver 170, and store the received analog dimming signal. While the input is deactivated, the plurality of driving devices 300 may supply a driving current corresponding to the stored analog dimming signal, to the plurality of LEDs 210.

The display apparatus 10 may include a plurality of scan lines S1 and S2 configured to provide a scan signal from the dimming driver 170 to the plurality of driving devices 300, and a plurality of data lines D1 and D2 configured to provide an analog dimming signal from the dimming driver 170 to the plurality of driving devices 300.

Driving devices 300a and 300b, or 300c and 300d for supplying driving currents to the LEDs 210 of the dimming blocks 200a and 200b, or 200c and 200d belonging to the same row may share the same scan line S1 or S2. For example, the first driving device 300a and the second driving device 300b may share the first scan line S1, and the third driving device 300c and the fourth driving device 300d may share the second scan line S2.

In addition, driving devices 300a and 300c, or 300b and 300d for supplying driving currents to the LEDs 210 of the dimming blocks 200a and 200c, or 200b and 200d belonging to the same column may share the same data line. For example, the first driving device 300a and the third driving device 300c may share the first data line D1, and the second driving device 300b and the fourth driving device 300d may share the second data line D2.

The input of the plurality of driving devices 300 may be activated by the scan signal of the dimming driver 170, and the driving devices 300 may receive the analog dimming signal of the dimming driver 170.

For example, while the dimming driver 170 outputs a scan signal through the first scan line S1, the first driving device 300a and the second driving device 300b may receive an analog dimming signal through the first data line D1 and the second data line D2, respectively. On the other hand, while the dimming driver 170 outputs the scan signal through the first scan line S1, the third and fourth driving devices 300c and 300d may not receive the analog dimming signal.

While the dimming driver 170 outputs a scan signal through the second scan line S2, the third driving device 300c and the fourth driving device 300d may receive an analog dimming signal through the first data line D1 and the second data line D2, respectively. On the other hand, while the dimming driver 170 outputs the scan signal through the second scan line S2, the first and second driving devices 300a and 300b may not receive the analog dimming signal.

In response to receiving the analog dimming signal, each of the plurality of driving devices 300 may store the received analog dimming signal, and supply a driving current to the plurality of LEDs 210 according to the stored analog dimming signal.

For example, while the dimming driver 170 outputs a scan signal through the first scan line S1, the third driving device 300c and the fourth driving device 300d may respectively supply a driving current to the plurality of LEDs included in each of the third dimming block 200c and the fourth dimming block 200d.

Further, while the dimming driver 170 outputs a scan signal through the second line S2, the first driving device 300a and the second driving device 300b may respectively supply a driving current to the plurality of LEDs included in each of the first dimming block 200a and the second dimming block 200b.

By the active-matrix driving method, the plurality of driving devices 300 may sequentially receive an analog dimming signal from the dimming driver 170, and even while the input is deactivated that is a state in which the plurality of driving devices 300 does not receive an analog dimming signal from the dimming driver 170, the plurality of driving devices 300 may supply a driving current to the plurality of LEDs.

Further, by performing the active-matrix driving method, the number of pins of the dimming driver 170 for providing an analog dimming signal to the plurality of dimming blocks 200 is reduced. In addition, the number of signal lines for providing an analog dimming signal from the dimming driver 170 to the plurality of dimming blocks 200 is reduced. Accordingly, the number of dimming blocks may be increased without a limitation in the number of pins of the dimming driver 170.

The plurality of driving devices 300 may include circuits of various topologies to implement the active-matrix driving method.

For example, as shown in FIG. 14, each of the plurality of driving devices 300 may include a one-capacitor two-transistor (1C2T) topology circuit.

Each of the plurality of driving devices 300 may include a driving transistor Tdr, a switching transistor Tsw, and a storage capacitor Cs.

The driving transistor Tdr includes an input terminal, an output terminal, and a control terminal. The input terminal of the driving transistor Tdr may be connected to a power source Vdd, and the output terminal may be connected to a plurality of light sources. The driving transistor Tdr may supply a driving current to the plurality of light sources 111 based on a voltage at the control terminal.

The storage capacitor Cs is provided between the output terminal and the control terminal of the driving transistor Tdr. The storage capacitor Cs may output a constant voltage by storing input charges. The driving transistor Tdr may supply a driving current to the plurality of light sources based on a voltage output by the storage capacitor Cs.

The switching transistor Tsw also includes an input terminal, an output terminal, and a control terminal. The input terminal of the switching transistor Tsw may be connected to the data line D1 or D2, and the output terminal of the switching transistor Tsw may be connected to the control terminal of the driving transistor Tdr. The control terminal of the switching transistor Tsw may be connected to the scan line S1 or S2.

The switching transistor Tsw may be turned on by a scan signal of the scan line S1 or S2 and may transmit an analog dimming signal of the data line D1 or D2 to the storage capacitor Cs and the driving transistor Tdr. The analog dimming signal of the data line data line D1 or D2 may be input to the control terminal of the driving transistor Tdr, and the driving transistor Tdr may supply a driving current corresponding to the analog dimming signal to the plurality of light sources. The storage capacitor Cs may store charges from the analog dimming signal, and output a voltage corresponding to the analog dimming signal.

Thereafter, even when the inputting of the scan signal is stopped and the switching transistor Tsw is turned off, the storage capacitor Cs may still output the voltage corresponding to the analog dimming signal, and the driving transistor Tdr may still supply the driving current corresponding to the analog dimming signal to the plurality of light sources.

A circuit as shown in FIG. 14 is an example of the driving device 300, but the circuit structure of the driving device 300 is not limited thereto. For example, the driving device 300 may include a 3T1C topology circuit in which a transistor is added to compensate for body effect of the driving transistor Tdr.

The driving device 300 may be provided in a single chip in which the circuit shown in FIG. 14 is integrated. In other words, the circuit shown in FIG. 14 may be integrated in a single semiconductor chip.

Meanwhile, as the number of dimming blocks 200 increases and the number of LEDs to be driven increases, the number of wires for driving the plurality of dimming blocks 200 increases.

For example, when the number of dimming blocks 200 increases, the number of data lines and source lines inevitably increases, so it is difficult to arrange wires for implementing the data lines and/or source lines, and it is also difficult to arrange wires for implementing driving devices.

As described above, according to the present disclosure, various types of wires may pass through the tunnel 253T between the first feeding pad 240a and the second feeding pad 240b that are in contact with the LED 210, Accordingly, even when the number of dimming blocks 200 increases, wires may be arranged more smoothly.

However, when the tunnel 253T is formed in a first direction on the protective layer 253 and there is a wire passing in a second direction different from the first direction, the tunnel 253T formed in the first direction may be obstructed and the utilization of the tunnel 253T may be lowered.

Hereinafter, a wiring structure of the LEDs 210 to improve the usability of the tunnel 253T will be described.

Figure 15:
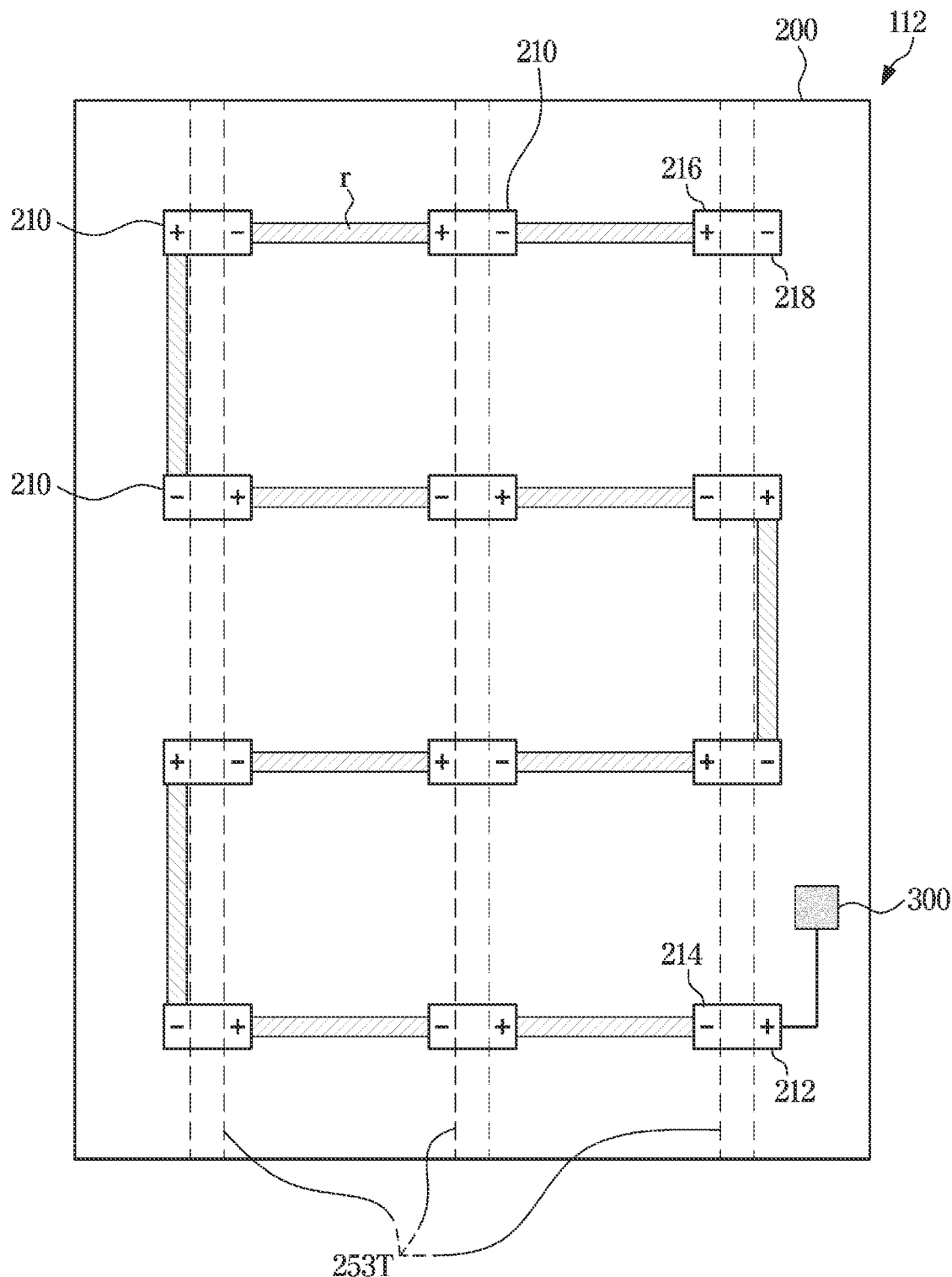
FIG. 15 is a view illustrating an example of a wiring structure of a dimming block according to an embodiment.
Figure 16:
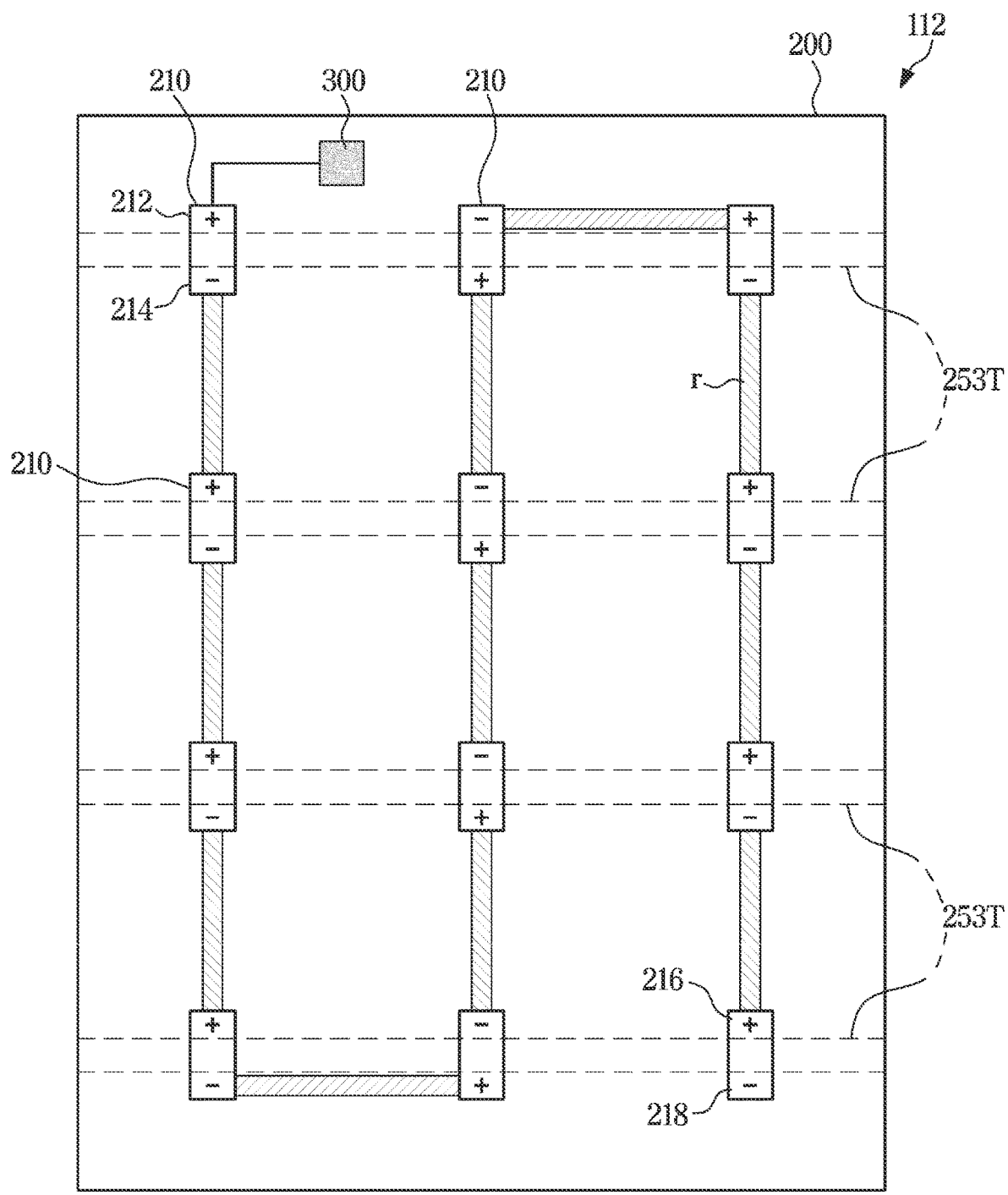
FIG. 16 is a view illustrating another example of a wiring structure of a dimming block according to an embodiment.

FIG. 15 is a view illustrating an example of a wiring structure of a dimming block according to an embodiment, and FIG. 16 is a view illustrating another example of a wiring structure of a dimming block according to an embodiment.

Referring to FIG. 15, the dimming block 200 according to an embodiment may include N*M LEDs 210 arranged in an N×M matrix form (in the case of FIG. 15, N is 4 and M is 3).

As described with reference to FIGS. 13 and 14, a plurality of LEDs 210 belonging to one dimming block 200 may be connected in series.

For example, an anode 212 and a cathode 214 of one LED 210 belonging to one dimming block may be connected to a driving device 300 and a cathode of a counterpart LED 210, respectively, and an anode 216 and a cathode 218 of another LED 210 may be connected to a cathode of a counterpart LED 210 and the ground, respectively, and an anode and a cathode of each of the remaining LEDs 210 may be connected to a cathode and an anode of a counterpart LED 210, respectively.

In order to utilize the tunnel 253T formed on the substrate 112, wires r (e.g., a line and/or pattern) connecting the anodes and the cathodes of the LEDs 210 need to be disposed without blocking the tunnel 253T.

According to various embodiments, when the length direction of the N×M LEDs 210 is the same as the length direction of the substrate 112, the tunnel 253T formed on the substrate 112 may include M tunnels 253T extending in the column direction of the N×M matrix.

According to various embodiments, some of the M tunnels 253T may not be formed.

In one embodiment, the polarity directions of N first LEDs 210 arranged in the same column among the N*M LEDs 210 may be alternated, and the polarity directions of M second LEDs 210 arranged in the same row among the N*M LEDs 210 may be the same as each other.

In FIG. 15, the left side of the LEDs 210 belonging to the first row is the anode and the right side is the cathode, the left side of the LEDs 210 belonging to the second row is the cathode and the right side is the anode, the polarity directions of the LEDs 210 belonging to the third row are the same as those of the LEDs 210 belonging to the first row, and the polarity directions of the LEDs 210 belonging to the fourth row are the same as those of the LEDs 210 belonging to the second row.

That is, among the plurality of LEDs 210 belonging to one dimming block 200, the LEDs 210 belonging to the same row have polarity directions that are the same as each other and are opposite to the polarity directions of the LEDs 210 belonging to columns adjacent thereto.

Accordingly, the wires r connecting the anodes and the cathodes of the plurality of LEDs 210 may be disposed in a form that may not block the tunnels 253T.

More specifically, anodes of LEDs 210 belonging to the same row, among the N×M LEDs 210, may be connected to cathodes of LEDs 210 adjacent thereto, and anodes of LEDs 210 disposed outermost may be connected to cathodes of LED 210 belonging to the same column.

Since the polarity direction of the first LED 210 disposed outermost side among the LEDs 210 belonging to the same row is different from the polarity direction of the second LED 210 belonging to the same column as the first LED 210, the wire r connecting the anode or the cathode of the first LED 210 to the cathode or the anode of the second LED 210 may be formed parallel to the tunnel 253T.

According to various embodiments, a driving device for applying a driving voltage to an anode of any one LED 210 may also be disposed at a position that does not exert an influence on the wire r.

For example, the driving device 300 may be disposed on the outside of the outermost tunnel 253T in the dimming block to apply a driving voltage to the anode of the outermost LED 210 (e.g., anode 212).

According to the present disclosure, among the plurality of LEDs 210 belonging to one dimming block, a plurality of LEDs 210 arranged in the same column are disposed such that polarity directions of the LEDs 210 are alternated, and a plurality of LEDs 210 arranged in the same row are disposed such that the polarity directions of the LEDs 210 are the same, thereby preventing tunnels 253T formed in the column direction from being blocked by wires r.

Referring to FIG. 16, a dimming block 200 according to an embodiment may include N×M LEDs 210 arranged in an N×M matrix form (in the case of FIG. 16, N is 4 and M is 3).

According to various embodiments, when the length direction of the N×M LEDs 210 is the same as the width direction of the substrate 112, the tunnel 253T formed on the substrate 112 may include N tunnels 253T extending in the row direction of the N×M matrix.

According to various embodiments, some of the N tunnels 253T may not be formed.

In one embodiment, the polarity directions of M first LEDs 210 arranged in the same row among the N×M LEDs 210 may be alternated, and the polarity directions of N second LEDs 210 arranged in the same row among the N×M LEDs 210 may be the same as each other.

In FIG. 16, the lower side of the LEDs 210 belonging to the first column is the cathode and the upper side is the anode, the lower side of the LEDs 210 belonging to the second column is the anode and the upper side is the cathode, the polarity directions of the LEDs 210 belonging to the third column are the same as those of the LEDs 210 belonging to the first column, and the polarity directions of the LEDs 210 belonging to the fourth column are the same as those of the LEDs 210 belonging to the second column.

That is, among the plurality of LEDs 210 belonging to one dimming block 200, the LEDs 210 belonging to the same column have polarity directions that are the same as each other and are opposite to the polarity directions of the LEDs 210 belonging to rows adjacent thereto.

Accordingly, the wires r connecting the anodes and the cathodes of the plurality of LEDs 210 may be disposed in a form that may not block the tunnels 253T.

More specifically, anodes of LEDs 210 belonging to the same column, among the N×M LEDs 210, may be connected to cathodes of LEDs 210 adjacent thereto, and anodes of LEDs 210 disposed outermost may be connected to cathodes of LED 210 belonging to the same row.

Since the polarity direction of the first LED 210 disposed outermost among the LEDs 210 belonging to the same column is different from the polarity direction of the second LED 210 belonging to the same row as the first LED 210, the wire r connecting the anode or the cathode of the first LED 210 to the cathode or the anode of the second LED 210 may be formed parallel to the tunnel 253T.

According to various embodiments, a driving device for applying a driving voltage to an anode of any one LED 210 may also be disposed at a position that does not exert an influence on the wire r.

For example, the driving device 300 may be disposed on the outside of an outermost tunnel 253T in the dimming block to apply a driving voltage to the anode 212 of the outermost LED 210.

According to the embodiment of FIG. 16, among the plurality of LEDs 210 belonging to one dimming block, a plurality of LEDs 210 arranged in the same row are disposed such that polarity directions of the LEDs 210 are alternated, and a plurality of LEDs 210 arranged in the same column are disposed such that the polarity directions of the LEDs 210 are the same, thereby preventing tunnels 253T formed in the row direction from being blocked by wires r.

Figure 17:
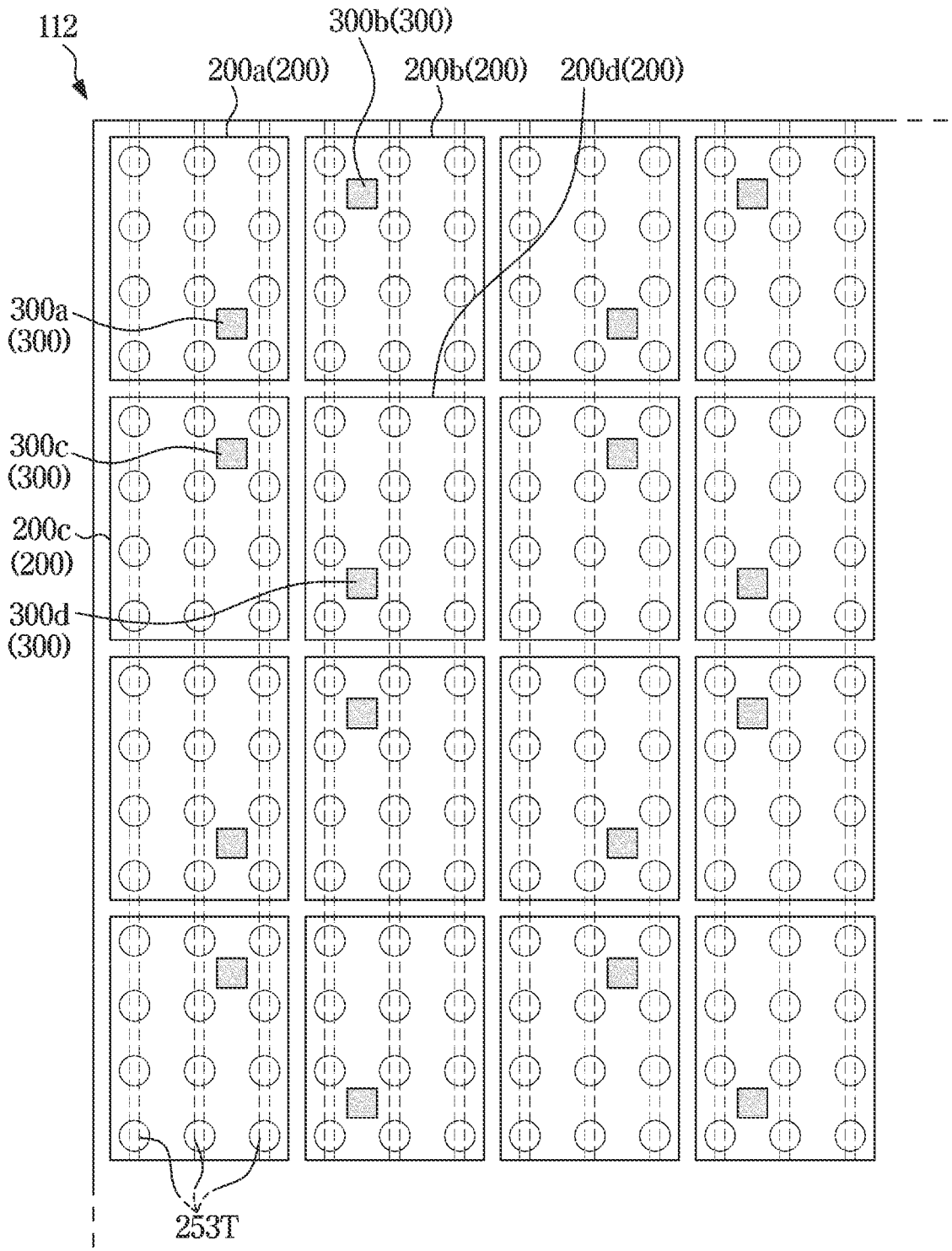
FIG. 17 is a view illustrating a state in which a plurality of the dimming blocks shown in FIG. 15 are coupled to each other.
Figure 18:
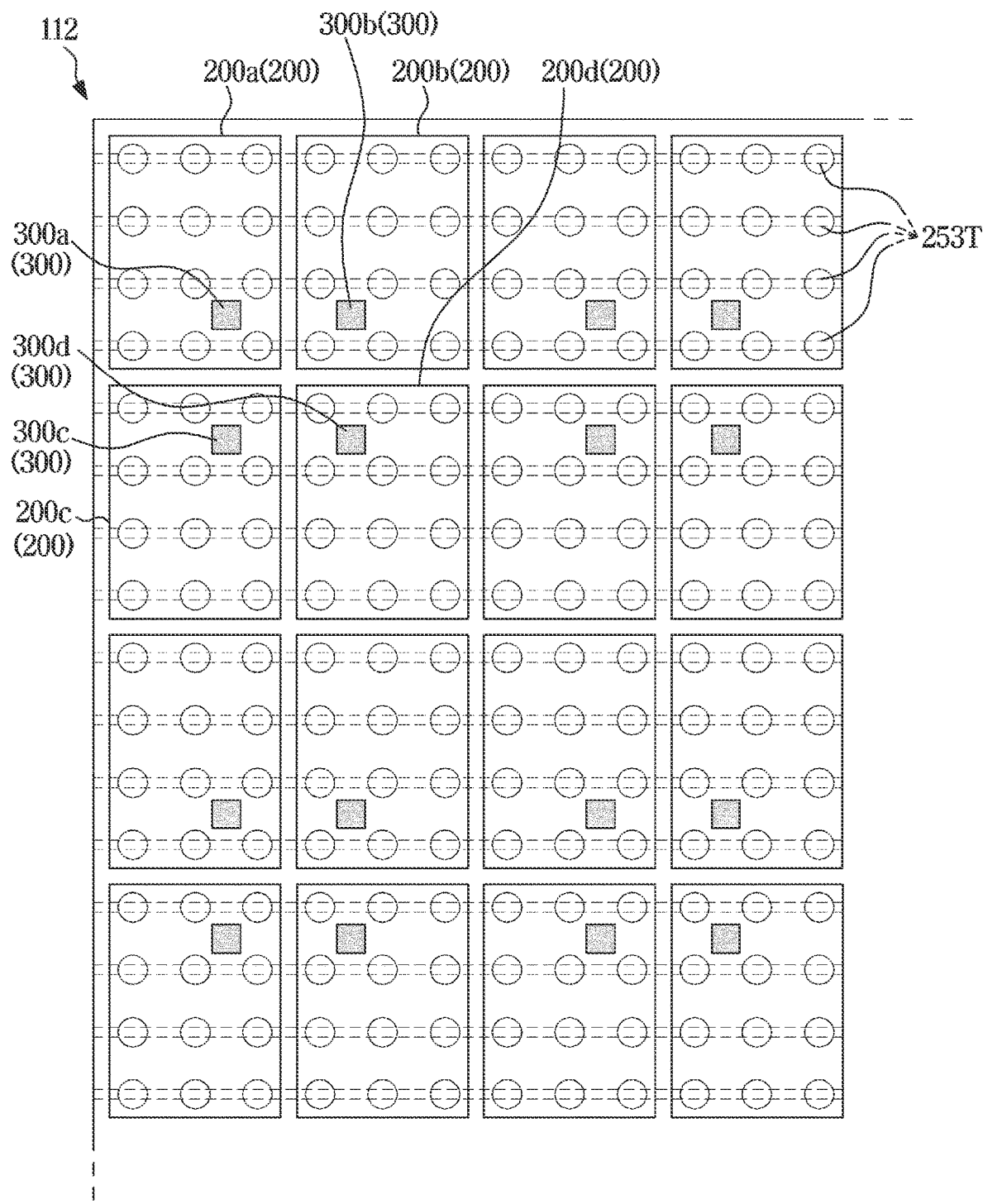
FIG. 18 is a view illustrating a state in which a plurality of the dimming blocks shown in FIG. 16 are coupled to each other.

FIG. 17 is a view illustrating a state in which a plurality of the dimming blocks shown in FIG. 15 are coupled to each other, and FIG. 18 is a view illustrating a state in which a plurality of the dimming blocks shown in FIG. 16 are coupled to each other.

Referring to FIG. 17, a plurality of dimming blocks 200 may also be disposed on the substrate 112 in a Q×T matrix form (Q and T are natural numbers).

Each of the dimming block 200 may have M tunnels 253T at the most, and the substrate 112 may be provided thereon with M*T tunnels 253T at the most.

In one embodiment, each of the tunnels 253T may extend to dimming blocks 200 disposed in the same column.

For example, M tunnels 253T formed in a first dimming block 200a may extend to a third dimming block 200c, and M tunnels 253T formed in a second dimming block 200b may extend to a fourth dimming block 200d.

According to various embodiments, in order to efficiently manage the number of tunnels 253T, driving devices 300a and 300c, or 300b and 300d disposed in dimming blocks 200a and 200c, or 200b and 200d belonging to the same column may be arranged on the same straight line in a column direction.

Meanwhile, according to various embodiments, positions of driving devices 300a and 300b, or 300c and 300d disposed in dimming blocks 200a and 200b, or 200c and 200d belonging to different columns may be different from each other.

Referring to FIG. 18, a plurality of dimming blocks may also be disposed on the substrate 112 in a Q*T matrix form (Q and T are natural numbers).

Each of the dimming block 200 may have N tunnels 253T at the most, and the substrate 112 may be provided thereon with N*Q tunnels 253T at the most.

In one embodiment, each of the tunnels 253T may extend to dimming blocks 200 disposed in the same row.

For example, N tunnels 253T formed in a first dimming block 200a may extend to a second dimming block 200b, and N tunnels 253T formed in a third dimming block 200c may extend to a fourth dimming block 200d.

According to various embodiments, in order to efficiently manage the number of tunnels 253T, driving devices 300a and 300b, or 300c and 300d disposed in dimming blocks 200a and 200b, or 200c and 200d belonging to the same row may be arranged on the same straight line in a row direction.

According to various embodiments, positions of driving devices 300a and 300c, or 300b and 300d disposed in dimming blocks 200a and 200c, or 200b and 200d belonging to different rows may be different from each other.

According to various embodiments, the plurality of tunnels 253T formed on the substrate 112 may have at least one wire formed therein that transmits electrical signals required for the operation of the display apparatus 10 and/or the light source apparatus 100.

That is, at least one wire that transmits electrical signals required for the operation of the display apparatus 10 and/or the light source apparatus 100 may be provided in the tunnel 253T formed in the substrate 112.

In various examples, at least one wire may include a plurality of scan lines S1 and S2, a plurality of data lines D1 and D2, and wires for implementing circuits of the plurality of driving devices 300, etc., and the type of the at least one wire is not limited thereto.

The at least one wire according to the present disclosure may be provided without limitation as long as it is configured to transmit electrical signals required for the operation of the display apparatus 10 and/or the light source apparatus 100.

According to the present disclosure, the lengths of the feeding pads formed on the substrate 112 while in contact with the plurality of LEDs 210 are formed short, and the space between the feeding pads is used as a space which wires may pass therethrough, thereby securing a physical space for arranging various wires.

Although exemplary embodiments of the present invention have been described for illustrative purposes, those skilled in the art will appreciate that various modifications, additions and substitutions are possible, without departing from the scope and spirit of the disclosure. Therefore, exemplary embodiments of the present invention have not been described for limiting purposes.

What is claimed is:
1. A display apparatus comprising:
a liquid crystal panel; and
a light source apparatus comprising a substrate and a plurality of light emitting diodes (LEDs) disposed on the substrate, wherein the substrate comprises a conductive layer and a protective layer disposed on the conductive layer, wherein each LED of the plurality of LEDs comprises a lower surface in contact with a first feeding pad and a second feeding pad, wherein the first feeding pad and the second feeding are formed on the substrate and are in contact with the conductive layer, wherein the lower surface of each LED of the plurality of LEDs comprises a first contact area configured to be in contact with the first feeding pad, a second contact area configured to be in contact with the second feeding pad, and a non-contact area distinct from the first contact area and the second contact, wherein each of the first contact area and the second contact area is smaller than the non-contact area, wherein the protective layer comprises a first window and a second window respectively exposing the first feeding pad and the second feeding pad to an outside, and at least one tunnel disposed between the first window and the second window, and wherein at least one side of the at least one tunnel is formed by the conductive layer.

2. The display apparatus of claim 1, wherein with respect to a length direction of the plurality of LEDs, each of a length of the first contact area and a length of the second contact area is shorter than a length of the non-contact area.

3. The display apparatus of claim 1, wherein with respect to a length direction of the plurality of LEDs, each of a length of the first window and a length of the second window is shorter than a distance between the first window and the second window.

4. The display apparatus of claim 1, wherein the at least one tunnel extends in a width direction of the plurality of LEDs.

5. The display apparatus of claim 4, wherein the plurality of LEDs are disposed on the substrate in a matrix comprising a plurality of rows and a plurality of columns, wherein a length direction of the each LED of the plurality of LEDs coincides with a width direction of the substrate, and the at least one tunnel comprises a plurality of tunnels corresponding to the plurality of rows which are oriented in a direction corresponding with the plurality of rows.

6. The display apparatus of claim 5, wherein LEDs among the plurality of LEDs forming a given row of the plurality of rows have alternating polarity directions, and LEDs among the plurality of LEDs forming a given column of the plurality of columns have identical polarity directions.

7. The display apparatus of claim 4, further comprising at least one wire configured to transmit an electrical signal required for operation of the display apparatus, wherein the at least one wire is disposed within the at least one tunnel.

8. The display apparatus of claim 1, wherein the plurality of LEDs are disposed on the substrate in a matrix comprising a plurality of rows and a plurality of columns, wherein a length direction of each LED of the plurality of LEDs coincides with a length direction of the substrate, and wherein the at least one tunnel comprises a plurality of tunnels corresponding to the plurality of columns which are oriented in a direction corresponding with the plurality of columns.

9. The display apparatus of claim 8, wherein LEDs among the plurality of LEDs forming a given column of the plurality of columns have alternating polarity directions, and LEDs among the plurality of LEDs forming a given row of the plurality of rows have identical polarity directions.

10. A light source apparatus comprising:

a substrate comprising a conductive layer and a protective layer disposed on the conductive layer; and a plurality of light emitting diodes (LEDs) disposed on the substrate, wherein each LED of the plurality of LEDs comprises a lower surface in contact with a first feeding pad and a second feeding pad, wherein the first feeding pad and the second feeding pad are formed on the substrate and are in contact with the conductive layer, wherein the lower surface of each LED of the plurality of LEDs comprises a first contact area configured to be in contact with the first feeding pad, a second contact area configured to be in contact with the second feeding pad, and a non-contact area distinct from the first contact area and the second contact area, wherein each of the first contact area and the second contact area is smaller than the non-contact area, wherein the protective layer comprises a first window and a second window respectively exposing the first feeding pad and the second feeding pad to an outside, and at least one tunnel disposed between the first window and the second window, and wherein at least one side of the at least one tunnel is formed by the conductive layer.

11. The light source apparatus of claim 10, wherein with respect to a length direction of the plurality of LEDs, each of a length of the first contact area and a length of the second contact area is shorter than a length of the non-contact area.

12. The light source apparatus of claim 10, wherein with respect to a length direction of the plurality of LEDs, each of a length of the first window and a length of the second window is shorter than a distance between the first window and the second window.

13. The light source apparatus of claim 10, wherein the at least one tunnel extends in a width direction of the plurality of LEDs.

14. A light source apparatus comprising:

a substrate comprising a conductive layer and a protective layer disposed on the conductive layer; and a light emitting diode (LED) disposed on the substrate, wherein the LED comprises a lower surface in contact with a first feeding pad and a second feeding pad, wherein the first feeding pad and the second feeding pad are formed on the substrate and are in contact with the conductive, wherein the lower surface of the LED comprises a first contact area configured to be in contact with the first feeding pad, a second contact area configured to be in contact with the second feeding pad, and a non-contact area distinct from the first contact area and the second contact area, wherein each of the first contact area and the second contact area is smaller than the non-contact area, wherein the protective layer comprises a first window and a second window respectively exposing the first feeding pad and the second feeding pad to an outside, and at least one tunnel disposed between the first window and the second window, and wherein at least one side of the tunnel is formed by the conductive layer.

15. The display apparatus of claim 14, wherein the tunnel extends in a width direction of the LED.

16. The display apparatus of claim 15, further comprising at least one wire configured to transmit an electrical signal required for operation of the display apparatus,
wherein the at least one wire is disposed within the tunnel.

* * * * *